(12) United States Patent
Choi et al.

(10) Patent No.: US 12,550,548 B2
(45) Date of Patent: Feb. 10, 2026

(54) DISPLAY PANEL AND DISPLAY APPARATUS

(71) Applicant: SAMSUNG DISPLAY CO., LTD., Yongin-si (KR)

(72) Inventors: Keunhee Choi, Yongin-si (KR); Jisun Kim, Yongin-si (KR); Youngwan Seo, Yongin-si (KR); Kyunghoe Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 741 days.

(21) Appl. No.: 17/854,494

(22) Filed: Jun. 30, 2022

(65) Prior Publication Data

US 2023/0110613 A1  Apr. 13, 2023

(30) Foreign Application Priority Data

Oct. 7, 2021 (KR) .................. 10-2021-0133447

(51) Int. Cl.
*H10K 59/131* (2023.01)
*H10K 59/121* (2023.01)
*H10K 59/123* (2023.01)
*H10K 59/124* (2023.01)
*H10K 102/00* (2023.01)

(52) U.S. Cl.
CPC ....... *H10K 59/131* (2023.02); *H10K 59/1213* (2023.02)

(58) Field of Classification Search
CPC ............. H10K 59/131; H10K 59/1213; H10K 59/123; H10K 2102/311; H10D 86/441; H10D 86/451
See application file for complete search history.

(56) References Cited

U.S. PATENT DOCUMENTS

| 9,252,388 B2 | 2/2016 | Jang et al. |
| 10,990,133 B2 | 4/2021 | Nakatogawa |
| 11,528,812 B2 | 12/2022 | Ahn et al. |
| 11,653,533 B2 | 5/2023 | Kim et al. |

(Continued)

FOREIGN PATENT DOCUMENTS

| CN | 112133733 A | 12/2020 |
| JP | 2019015937 A | 1/2019 |

(Continued)

*Primary Examiner* — Monica D Harrison
*Assistant Examiner* — Moataz Khalifa
(74) *Attorney, Agent, or Firm* — CANTOR COLBURN LLP

(57) ABSTRACT

A display panel includes: a substrate including a center area, a corner area, and a middle area arranged between the center area and the corner area, where the corner area includes an extension area extending in a direction away from the center area; a first line arranged in the middle area; a second line electrically connected to the first line and including a first portion and a second portion which extend from the middle area to the extension area; a first pixel circuit arranged in the extension area; a first connection line electrically connected to the first pixel circuit and extending from the corner area to the middle area and disposed between the first portion and the second portion of the second line; and a first display element electrically connected to the first connection line and arranged in the middle area.

20 Claims, 17 Drawing Sheets

(56) References Cited

U.S. PATENT DOCUMENTS

| | | | |
|---|---|---|---|
| 11,659,742 B2* | 5/2023 | Won | H10K 59/1216 |
| | | | 257/72 |
| 12,284,888 B2 | 4/2025 | Kim et al. | |
| 2017/0219895 A1* | 8/2017 | Yu | G09G 3/2092 |
| 2020/0286976 A1 | 9/2020 | Noh et al. | |
| 2021/0376038 A1* | 12/2021 | Won | H10D 86/441 |
| 2022/0069051 A1 | 3/2022 | Lee et al. | |
| 2022/0149118 A1 | 5/2022 | Kim et al. | |
| 2022/0406872 A1* | 12/2022 | Cho | H10K 59/131 |

FOREIGN PATENT DOCUMENTS

| | | |
|---|---|---|
| KR | 101420332 B1 | 7/2014 |
| KR | 1020200063379 A | 6/2020 |
| KR | 1020200078175 A | 7/2020 |
| KR | 1020200108176 A | 9/2020 |
| KR | 1020200138500 A | 12/2020 |
| KR | 1020210034158 A | 3/2021 |
| KR | 1020220030467 A | 3/2022 |
| KR | 1020220064479 A | 5/2022 |

\* cited by examiner

DISPLAY PANEL AND DISPLAY APPARATUS

This application claims priority to Korean Patent Application No. 10-2021-0133447, filed on Oct. 7, 2021, and all the benefits accruing therefrom under 35 U.S.C. § 119, the content of which in its entirety is herein incorporated by reference.

BACKGROUND

1. Field

One or more embodiments relate to a display panel and a display apparatus including the display panel.

2. Description of the Related Art

A mobile electronic device has become widely used. As the mobile electronic device, a tablet personal computer ("PC") has become broadly used in recent times, in addition to a small electronic device, such as a mobile phone.

Such a mobile electronic device includes a display in order to provide a user with various functions, for example, visual information such as an image or a video. With the miniaturization of various components for driving the electronic device, the importance of a display apparatus for the electronic device has continually increased, and a structure to bend a flat display apparatus to have a predetermined angle has been developed.

SUMMARY

A display apparatus may include a display panel for displaying an image. The display panel may include a corner area that is bent at a corner, and relatively great stress may be generated in this corner area.

One or more embodiments provide a display panel and a display apparatus having improved reliability with the reduction in stress generated in a corner area.

Additional aspects will be set forth in part in the description which follows and, in part, will be apparent from the description, or may be learned by practice of the presented embodiments of the disclosure.

According to one or more embodiments, a display panel includes" a substrate including a center area, a corner area, and a middle area arranged between the center area and the corner area, where the corner area includes an extension area extending in a direction away from the center area; a first line arranged in the middle area; a second line electrically connected to the first line and including a first portion and a second portion which extend from the middle area to the extension area; a first pixel circuit arranged in the extension area; a first connection line electrically connected to the first pixel circuit and extending from the corner area to the middle area and disposed between the first portion and the second portion of the second line; and a first display element electrically connected to the first connection line and arranged in the middle area.

The extension area may include: a pixel area and an end area arranged outside the pixel area, and the first portion and the second portion of the second line may meet each other in the end area to be integrally provided.

The display panel may further include: a first insulating layer arranged between the first line and the second line and defining a contact hole therein; and a second insulating layer arranged on the second line, where the first line and the second line are electrically connected to each other through the contact hole, and the first connection line is arranged between the first insulating layer and the second insulating layer.

The display panel may further include: a driving circuit arranged in the middle area, and a signal line electrically connected to the driving circuit and extending from the middle area to the extension area.

The display panel may further include: a second pixel circuit arranged in the extension area, a second connection line electrically connected to the second pixel circuit, and a second display element electrically connected to the second connection line and arranged in the extension area, where the second pixel circuit is arranged to be farther from the middle area than the first pixel circuit.

The display panel may further include: a third pixel circuit arranged in the extension area, a third connection line electrically connected to the third pixel circuit, and a third display element electrically connected to the third connection line and arranged in the extension area, where the third pixel circuit is arranged to be farther from the middle area than the second pixel circuit, and the third display element is arranged to be farther from the middle area than the second display element.

The extension area may include a pixel area and an end area arranged outside the pixel area, the third display element may be arranged in the pixel area and includes a pixel electrode, an emission layer, and an opposite electrode, and the second line may be electrically connected to the opposite electrode in the end area.

The second display element may be provided in a multiple number in the extension area, and the plurality of second display elements may be arranged in parallel with each other in a direction crossing an extension direction of the extension area at right angles.

The extension area may be provided in a multiple number, and a space area may be defined between an adjacent pair of the plurality of extension areas.

The substrate may further include a first area adjacent to the center area in a first direction and a second area adjacent to the center area in a second direction crossing the first direction, and the middle area and the corner area may at least partially surround the first area, the center area, and the second area.

According to one or more embodiments, a display apparatus includes: a display panel and a cover window arranged on the display panel. The display panel includes a substrate including a center area, a corner area, and a middle area arranged between the center area and the corner area, the corner area including an extension area extending in a direction away from the center area; a first line arranged in the middle area; a second line electrically connected to the first line and including a first portion and a second portion which extend from the middle area to the extension area; a first pixel circuit arranged in the extension area, a first connection line electrically connected to the first pixel circuit and extending from the corner area to the middle area and disposed between the first portion and the second portion of the second line; and a first display element electrically connected to the first connection line and arranged in the middle area; and the display panel is bent in the corner area.

The extension area may include a pixel area and an end area arranged outside the pixel area, and the first portion and the second portion of the second line may meet each other in the end area to be integrally provided.

The display panel may further include a first insulating layer arranged between the first line and the second line and defining a contact hole therein and a second insulating layer arranged on the second line, the first line and the second line may be electrically connected to each other through the contact hole, and the first connection line may be arranged between the first insulating layer and the second insulating layer.

The display panel may further include a driving circuit arranged in the middle area and a signal line electrically connected to the driving circuit and extending from the middle area to the extension area.

The display panel may further include a second pixel circuit arranged in the extension area and a second display element electrically connected to the second pixel circuit and arranged in the extension area. The second pixel circuit may be arranged to be farther from the middle area than the first pixel circuit.

The display panel may further include a third pixel circuit arranged in the extension area, a third connection line electrically connected to the third pixel circuit, and a third display element electrically connected to the third connection line and arranged in the extension area. The third pixel circuit may be arranged to be farther from the middle area than the second pixel circuit, and the third display element may be arranged to be farther from the middle area than the second display element.

The extension area may include a pixel area and an end area arranged outside the pixel area, the third display element may be arranged in the pixel area and may include a pixel electrode, an emission layer, and an opposite electrode, and the second line may be electrically connected to the opposite electrode in the end area.

The second display element may be provided in a multiple number in the extension area, and the plurality of second display elements may be arranged in parallel with each other in a direction crossing the extension direction of the extension area at right angles.

The extension area may be provided in a multiple number, and a space area may be defined between an adjacent pair of the plurality of extension areas.

The substrate may further include a first area adjacent to the center area in a first direction and a second area adjacent to the center area in a second direction crossing the first direction, the middle area and the corner area may at least partially surround the first area, the center area, and the second area, and the display panel may be bent in the first area and the second area.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
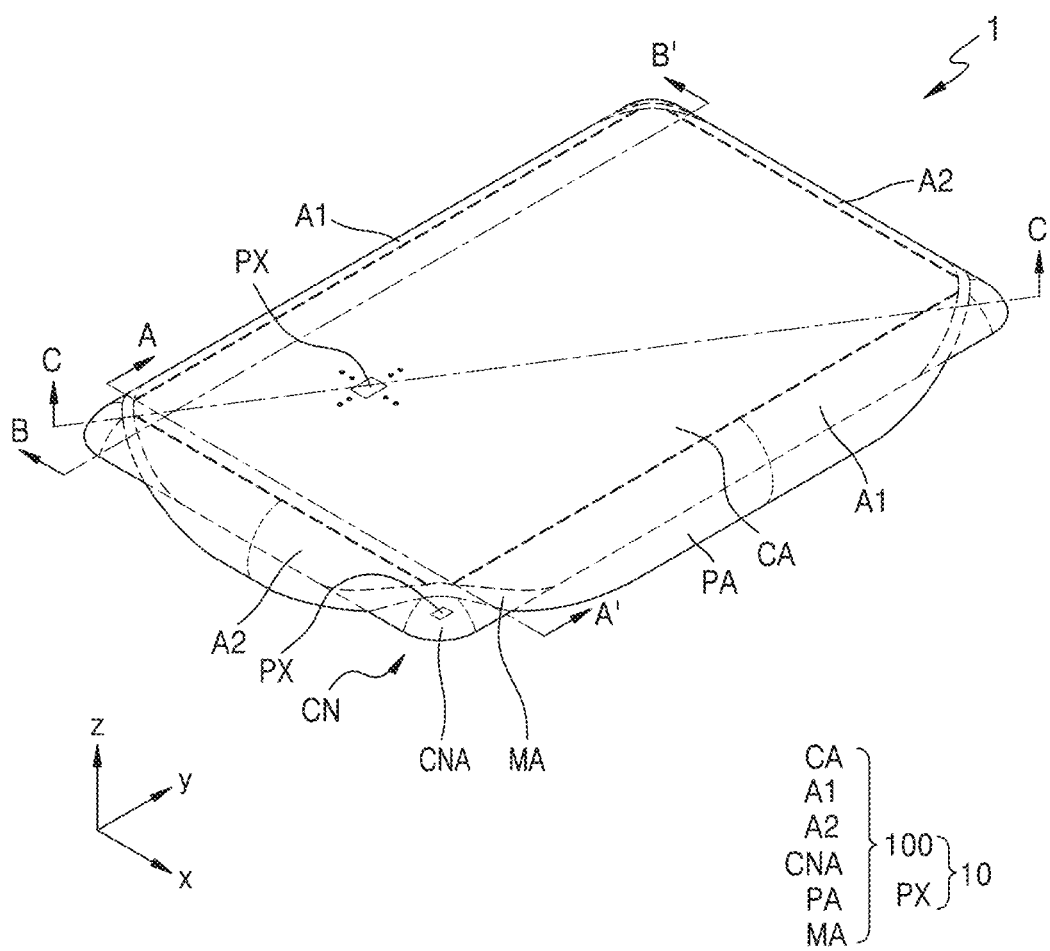
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

While the disclosure is capable of various modifications and alternative forms, embodiments thereof are shown by way of example in the drawings and will herein be described in detail. Effects and characteristics of the disclosure, and realizing methods thereof will become apparent by referring to the drawings and embodiments described in detail below. However, the disclosure is not limited to the embodiments disclosed hereinafter and may be realized in various forms.

Hereinafter, the embodiments of the disclosure will be described in detail with reference to the accompanying drawings. In the descriptions, like reference numerals refer to the like elements and the same descriptions will not be repeated.

It will be understood that the terms "first," "second," etc. may be used herein to describe various components, these components should not be limited by these terms. These components are only used to distinguish one component from another.

As used herein, the singular expressions "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being formed "on" another layer, area, or element, it can be directly or indirectly formed on the other layer, region, or element. That is, for example, intervening layers, regions, or elements may be present.

Sizes of elements in the drawings may be exaggerated for convenience of explanation. For example, sizes and thicknesses of the elements in the drawings are randomly indicated for convenience of explanation, and thus, the disclosure is not necessarily limited to the illustrations of the drawings.

When a certain embodiment may be implemented differently, a specific process order may be performed differently from the described order. For example, two consecutively described processes may be performed substantially at the same time or performed in an order opposite to the described order.

In the embodiments hereinafter, it will be understood that when an element, an area, or a layer is referred to as being connected to another element, area, or layer, it can be directly or indirectly connected to the other element, area, or layer. For example, it will be understood in this specification that when an element, an area, or a layer is referred to as being in contact with or being electrically connected to another element, area, or layer, it can be directly or indirectly in contact with or electrically connected to the other element, area, or layer.

A display apparatus may be an apparatus displaying a video or a static image and may be used as a display screen of various products including not only portable electronic devices, such as a mobile phone, a smartphone, a tablet personal computer (PC), a mobile communication terminal, an electronic notebook, an electronic book, a portable multimedia player ("PMP"), a navigation device, and an ultra mobile PC ("UMPC"), but also other devices, such as a television, a notebook computer, a monitor, a billboard, and an Internet of things ("IOT") device. Also, the display apparatus according to an embodiment may be used in wearable devices, such as a smart watch, a watch phone, a glasses-type display, and a head-mounted display ("HMD"). Also, the display apparatus according to an embodiment may be used as: a gauge of a vehicle, a center fascia of a vehicle, or a center information display on a dashboard; a room mirror display substituting a side-view mirror of a vehicle; or a display disposed on a rear surface of a front seat, as an entertainment device for a backseat of a vehicle.

Figure 2A:
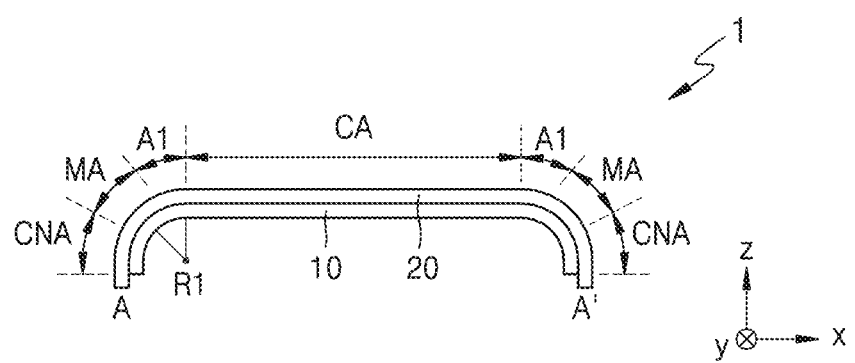
FIG. 2A is a cross-sectional view of the display apparatus of FIG. 1, taken along line A-A'.
Figure 2B:
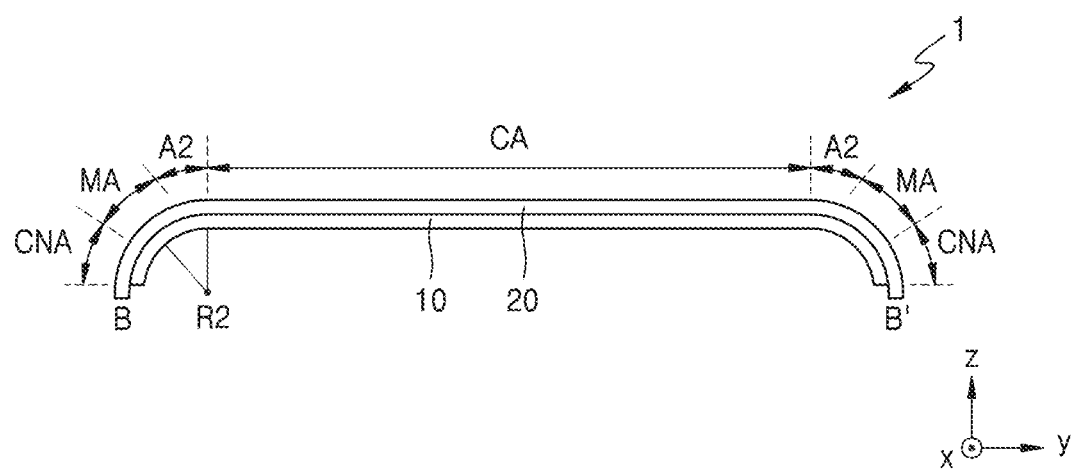
FIG. 2B is a cross-sectional view of the display apparatus of FIG. 1, taken along line B-B'.
Figure 2C:
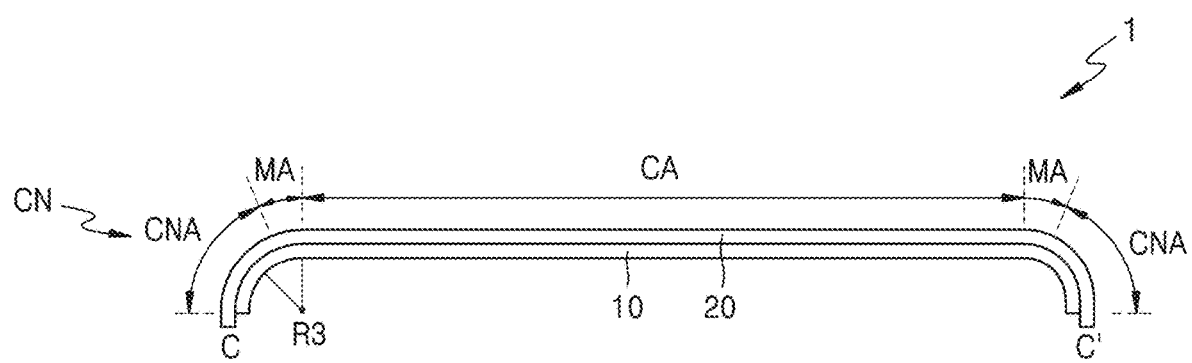
FIG. 2C is a cross-sectional view of the display apparatus of FIG. 1, taken along line C-C'.

FIG. 1 is a schematic perspective view of a display apparatus 1 according to an embodiment. FIG. 2A is a cross-sectional view of the display apparatus 1 of FIG. 1, taken along line A-A'. FIG. 2B is a cross-sectional view of the display apparatus 1 of FIG. 1, taken along line B-B'. FIG. 2C is a cross-sectional view of the display apparatus 1 of FIG. 1, taken along line C-C'.

Referring to FIGS. 1 and 2A through 2C, the display apparatus 1 may display an image. The display apparatus 1 may have an edge in a first direction and an edge in a second direction. Here, the first direction and the second direction may cross each other. For example, the first direction and the second direction may make an acute angle with each other. As another example, the first direction and the second direction may make an obtuse angle with each other or cross each other at right angles. Hereinafter, a case in which the first direction and the second direction cross each other at right angles is mainly described in detail. For example, the first direction may be an x direction or a −x direction, and the second direction may be a y direction or a −y direction.

According to an embodiment, a corner CN at which an edge in the first direction (for example, the x direction or the −x direction), meets an edge in the second direction (for example, the y direction or the −y direction) may have a predetermined curvature.

The display apparatus 1 may include a cover window 20 and a display panel 10. The cover window 20 may protect the display panel 10. According to an embodiment, the cover window 20 may be arranged on the display panel 10. According to an embodiment, the cover window 20 may include a flexible window. The cover window 20 may protect the display panel 10 by being easily bent according to an external force without cracks, etc. being generated. The cover window 20 may include glass, sapphire, and plastic. The cover window 20 may include, for example, ultra-thin glass ("UTG") or colorless polyimide ("CPI").

The display panel 10 may be arranged below the cover window 20. Although not shown, the display panel 10 and the cover window 20 may adhere to each other via a transparent adhesion member, such as an optically clear adhesive ("OCA") film.

The display panel 10 may display an image. The display panel 10 may include a substrate 100 and a pixel PX. The display panel 10 may include a center area CA, a first area A1, a second area A2, a corner area CNA, a middle area MA, and a peripheral area PA. The center area CA, the first area A1, the second area A2, the corner area CNA, the middle area MA, and the peripheral area PA may be defined in the substrate 100 of the display panel 10. In other words, the substrate 100 may include the center area CA, the first area A1, the second area A2, the corner area CNA, the middle area MA, and the peripheral area PA. Hereinafter, descriptions are given in detail mainly based on the case in which the center area CA, the first area A1, the second area A2, the corner area CNA, the middle area MA, and the peripheral area PA are defined in the substrate 100.

The center area CA may be flat. According to an embodiment, the display apparatus 1 may provide most of the image on the center area CA.

The display panel 10 may be bent in the first area A1. The first area A1 may be bent while being adjacent to the center area CA in the first direction (for example, the x direction or the −x direction). The first area A1 may be defined as an area bent from the center area CA on a cross-section (for example, an x-z section) in the first direction (for example, the x direction or the −x direction). The first area A1 may extend in the second direction (for example, the y direction or the −y direction). In other words, the first area A1 may not bend on a section (for example, a y-z section) in the second direction (for example, the y direction or the −y direction). The first area A1 may be bent with respect to an axis extending in the second direction (for example, the y direction or the −y direction). FIG. 2A illustrates that the first area A1 (i.e., right one in FIG. 2A) extending from the center area CA in the x direction to be bent and the first area A1 (i.e., left one in FIG. 2A) extending from the center area CA in the −x direction to be bent may have the same curvature. However, according to another embodiment, the first area A1 extending from the center area CA in the x direction to be bent and the first area A1 extending from the center area CA in the −x direction to be bent may have different curvatures from each other.

The display panel 10 may bend in the second area A2. The second area A2 may be bent while being adjacent to the center area CA in the second direction (for example, the y direction or the −y direction). The second area A2 may be defined as an area bent from the center area CA on the cross-section (for example, the y-z section) in the second direction (for example, the y direction or the −y direction)

may be. The second area A2 may extend in the first direction (for example, the x direction or the −x direction). The second area A2 may not bend on the cross-section (for example, the x-z section) in the first direction (for example, the x direction or the −x direction). The second area A2 may be bent with respect to an axis extending in the first direction (for example, the x direction or the −x direction). FIG. 2B illustrates that the second area A2 extending from the center area CA in the y direction to be bent and the second area A2 extending from the center area CA in the −y direction to be bent may have the same curvature. However, according to another embodiment, the second area A2 extending from the center area CA in the y direction to be bent and the second area A2 extending from the center area CA in the −y direction to be bent may have different curvatures from each other.

The display panel 10 may bend in the corner area CNA. The corner area CNA may be an area arranged at the corner CN. According to an embodiment, the corner area CNA may be an area at which an edge of the display apparatus 1 in the first direction (for example, the x direction or the −x direction) and an edge of the display apparatus 1 in the second direction (for example, the y direction or the −y direction) meet each other. According to an embodiment, the corner area CNA may at least partially surround the center area CA, the first area A1, and the second area A2. The corner area CNA may at least partially surround the center area CA, the first area A1, the second area A2, and the middle area MA. When the first area A1 extends in the first direction (for example, the x direction or the −x direction) and bends, and the second area A2 extends in the second direction (for example, the y direction or the −y direction) and bends, at least a portion of the corner area CNA may extend in the first direction (for example, the x direction or the −x direction) and may bend and may extend in the second direction (for example, the y direction or the −y direction) and may bend. In other words, at least a portion of the corner area CNA may be a curved area having a plurality of curvatures in a plurality of directions. According to an embodiment, the corner area CNA may be provided in a multiple number.

The middle area MA may be arranged between the center area CA and the corner area CNA. According to an embodiment, the middle area MA may extend between the first area A1 and the corner area CNA. According to an embodiment, the middle area MA may extend between the second area A2 and the corner area CNA. According to an embodiment, the middle area MA may bend. A driving circuit for providing an electrical signal to the pixel PX and/or power lines for providing power to the pixel PX may be arranged in the middle area MA. In this case, the pixel PX arranged in the middle area MA may overlap the driving circuit and/or the power lines in a plan view.

The peripheral area PA may be arranged outside the center area CA. According to an embodiment, the peripheral area PA may be arranged outside the first area A1. The peripheral area PA may extend from the first area A1. According to an embodiment, the peripheral area PA may be arranged outside the second area A2. The peripheral area PA may extend from the second area A2. The pixel PX may not be arranged in the peripheral area PA. Thus, the peripheral area PA may be a non-display area where an image is not displayed. A driving circuit for providing an electrical signal to the pixel PX and/or power lines for providing power to the pixel PX may be arranged in the peripheral area PA.

Referring to FIG. 2A, the first area A1, the middle area MA, and a portion of the corner area CNA may bend by a first radius of curvature R1. Referring to FIG. 2B, the second area A2, the middle area MA, and another portion of the corner area CNA may bend by a second radius of curvature R2. Referring to FIG. 2C, the middle area MA and yet another portion of the corner area CNA may bend by a third radius of curvature R3.

The pixel PX may be arranged on the substrate 100. According to an embodiment, the pixel PX may be implemented as a display element. According to an embodiment, the pixel PX may be provided in a multiple number, and the plurality of pixels PX may emit light to display an image. According to an embodiment, each of the plurality of pixels PX may include a red sub-pixel, a green sub-pixel, and a blue sub-pixel. Alternatively, each of the plurality of pixels PX may include a red sub-pixel, a green sub-pixel, a blue sub-pixel, and a white sub-pixel.

The pixel PX may be arranged in at least one of the center area CA, the first area A1, the second area A2, and the corner area CNA. According to an embodiment, the plurality of pixels PX may be arranged in the center area CA, the first area A1, the second area A2, the corner area CNA, and the middle area MA. In this case, the display apparatus 1 may display an image in the center area CA, the first area A1, the second area A2, the corner area CNA, and the middle area MA. According to an embodiment, the display apparatus 1 may provide a separate image in each of the center area CA, the first area A1, the second area A2, the corner area CNA, and the middle area MA. According to another embodiment, the display apparatus 1 may provide a portion of an image in each of the center area CA, the first area A1, the second area A2, the corner area CNA, and the middle area MA.

In the display apparatus 1, the plurality of pixels PX may be arranged not only in the center area CA, but also in the first area A1, the second area A2, the middle area MA, and the corner area CNA, for displaying an image. Thus, a ratio of a display area in the display apparatus 1, the display area corresponding to an area for displaying an image, may be increased. Also, because the display apparatus 1 may display an image by being bent at the corner CN, an aesthetic sense may be improved.

Figure 3:
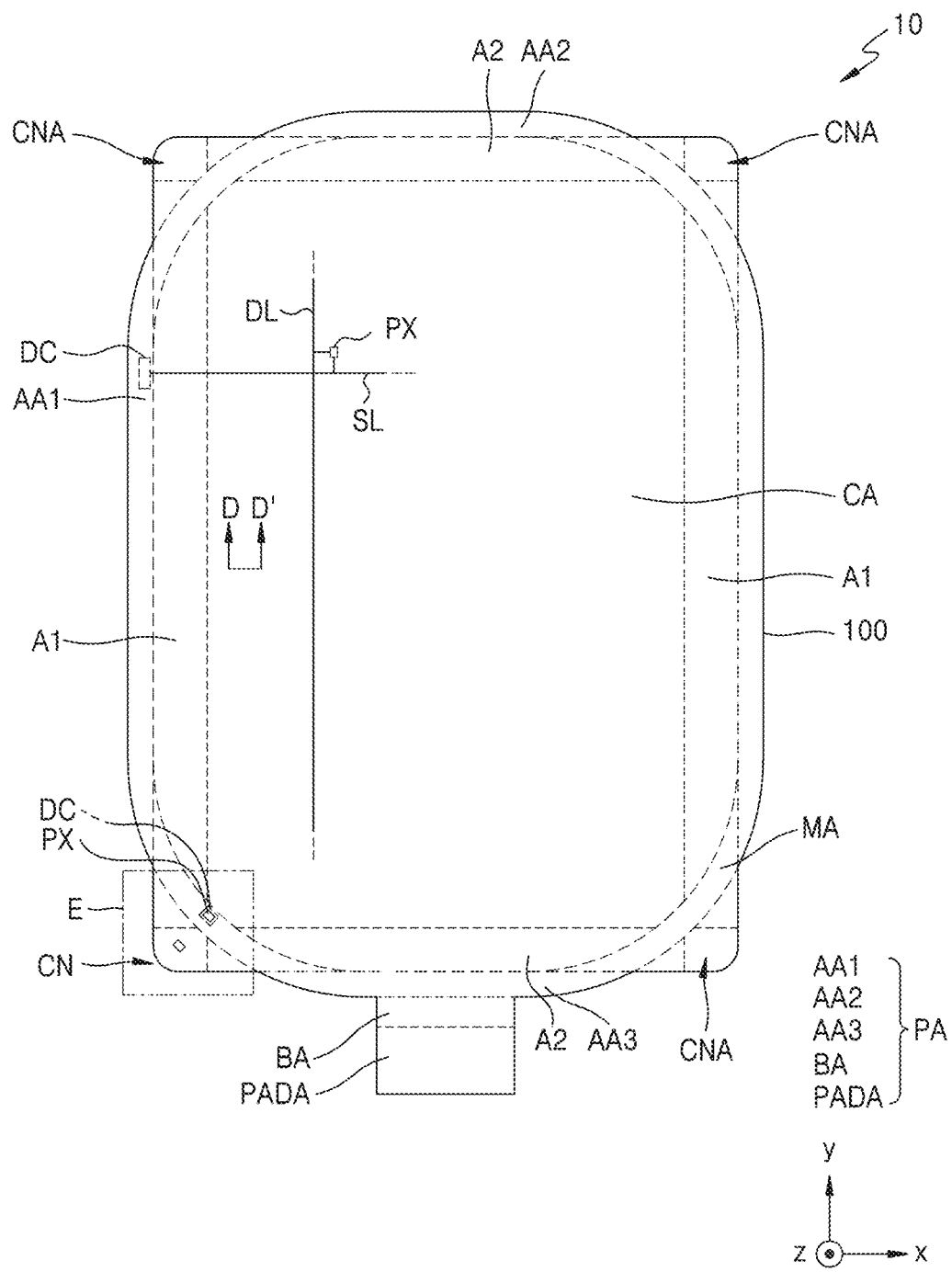
FIG. 3 is a schematic plan view of a display panel according to an embodiment.

FIG. 3 is a schematic plan view of the display panel 10 according to an embodiment. FIG. 3 is a schematic plan view of an unbent state of the display panel 10.

Referring to FIG. 3, the display panel 10 may display an image. The display panel 10 may include the substrate 100, the pixel PX, and a driving circuit DC. The substrate 100 may include the center area CA, the first area A1, the second area A2, the corner area CNA, the middle area MA, and the peripheral area PA. The center area CA may be flat. According to an embodiment, the display panel 10 may provide most of an image on the center area CA.

The first area A1 may be adjacent to the center area CA in the first direction (for example, the x direction or the −x direction). According to an embodiment, the first area A1 may be arranged between the center area CA and the peripheral area PA. The first area A1 may extend in the second direction (for example, the y direction or the −y direction).

The second area A2 may be adjacent to the center area CA in the second direction (for example, the y direction or the −y direction). According to an embodiment, the second area A2 may be arranged between the center area CA and the peripheral area PA. The second area A2 may extend in the first direction (for example, the x direction or the −x direction).

The corner area CNA may be an area arranged at the corner CN of the display panel 10. According to an embodiment, the corner area CNA may be an area at which an edge of the display panel 10 in the first direction (for example, the x direction or the −x direction) and an edge of the display panel 10 in the second direction (for example, the y direction or the −y direction) meet each other. According to an embodiment, the corner area CNA and the middle area MA may at least partially surround the center area CA, the first area A1, and the second area A2. The corner area CNA may at least partially surround the center area CA, the first area A1, the second area A2, and the middle area MA.

The middle area MA may be arranged between the center area CA and the corner area CNA. According to an embodiment, the middle area MA may extend between the first area A1 and the corner area CNA. According to an embodiment, the middle area MA may extend between the second area A2 and the corner area CNA. The driving circuit DC for providing an electrical signal to the pixel PX and/or power lines for providing power to the pixel PX may be arranged in the middle area MA. The pixel PX arranged in the middle area MA may overlap the driving circuit DC and/or the power lines in a plan view.

The peripheral area PA may be arranged outside the center area CA. The pixel PX may not be arranged in the peripheral area PA. Thus, the peripheral area PA may be a non-display area where an image is not displayed. The driving circuit DC for providing an electrical signal to the pixel PX and/or power lines for providing power to the pixel PX may be arranged in the peripheral area PA. The peripheral area PA may include a first adjacent area AA1, a second adjacent area AA2, a third adjacent area AA3, a bending area BA, and a pad area PADA.

The first adjacent area AA1 may be arranged outside the first area A1. In other words, the first area A1 may be arranged between the first adjacent area AA1 and the center area CA. According to an embodiment, the first adjacent area AA1 may extend from the first area A1 in the first direction (for example, the x direction or the −x direction). According to an embodiment, the driving circuit DC and/or the power lines may be arranged in the first adjacent area AA1.

The second adjacent area AA2 and the third adjacent area AA3 may be arranged outside the second area A2. In other words, the second area A2 may be arranged between the second adjacent area AA2 and the center area CA. Also, the second area A2 may be arranged between the third adjacent area AA3 and the center area CA. According to an embodiment, the second adjacent area AA2 and the third adjacent area AA3 may extend in the second direction (for example, the y direction or the −y direction). The center area CA may be arranged between the second adjacent area AA2 and the third adjacent area AA3.

The bending area BA may be arranged outside the third adjacent area AA3. In other words, the third adjacent area AA3 may be arranged between the bending area BA and the second area A2. The display panel 10 may be bent in the bending area BA. In this case, the pad area PADA may face a rear surface of the display panel 10 that is opposite to an upper surface of the display panel 10 that displays an image. Thus, an area of the peripheral area PA that is seen by a user may be reduced.

The pad area PADA may be arranged outside the bending area BA. In other words, the bending area BA may be arranged between the third adjacent area AA3 and the pad area PADA. A pad (not shown) may be arranged in the pad area PADA. The display panel 10 may receive an electrical signal and/or a power voltage through the pad.

At least one of the first area A1, the second area A2, the corner area CNA, and the middle area MA may be bent. For example, the first area A1 and a portion of the corner area CNA may bend on a section (for example, the x-z section) in the first direction (for example, the x direction or the −x direction). The second area A2 and another portion of the corner area CNA may bend on a section (for example, the y-z section) in the second direction (for example, the y direction or the −y direction). Yet another portion of the corner area CNA may bend on the cross-section (for example, the x-z section) in the first direction (for example, the x direction or the −x direction) and may bend on the cross-section (for example, the y-z section) in the second direction (for example, the y direction or the −y direction).

When the corner area CNA is bent, the compressive strain occurring in the corner area CNA may be greater than the tensile strain occurring in the corner area CNA. In this case, it may be required to implement the substrate 100 and a multi-layered structure on the substrate 100 that may be contracted in at least a portion of the corner area CNA. According to an embodiment, a structure of the display panel 10 in the corner area CNA may be different from a structure of the display panel 10 in the center area CA.

The pixel PX and the driving circuit DC may be arranged on the substrate 100. The pixel PX may be arranged in at least one of the center area CA, the first area A1, the second area A2, the corner area CNA, and the middle area MA. According to an embodiment, the pixel PX may include a display element. According to an embodiment, the display element may include an organic light-emitting diode including an organic emission layer. Alternatively, the display element may include a light-emitting diode including an inorganic emission layer. A size of the light-emitting diode may be micro-scale or nano-scale. For example, the light-emitting diode may include a micro-light-emitting diode. Alternatively, the light-emitting diode may include a nanorod-light-emitting diode. The nanorod-light-emitting diode may include GaN. According to an embodiment, a color conversion layer may be arranged on the nanorod-light-emitting diode. The color conversion layer may include quantum dots. Alternatively, the display element may include a quantum dot light-emitting diode including a quantum dot emission layer.

The pixel PX may include a plurality of sub-pixels, and each of the plurality of sub-pixels may emit a predetermined color of light by using the display element. In this specification, a sub-pixel denotes a smallest unit for realizing an image, which corresponds to an emission area. When the organic light-emitting diode is implemented as the display element, the emission area may be defined by an opening of a pixel-defining layer. This aspect will be described below.

The driving circuit DC may provide a signal to each pixel PX. According to an embodiment, the driving circuit DC may be a scan driving circuit configured to provide a scan signal to each pixel PX through a scan line SL. According to another embodiment, the driving circuit DC may be an emission control driving circuit configured to provide an emission control signal to each pixel PX through an emission control line (not shown). Alternatively, the driving circuit DC may be a data driving circuit configured to provide a data signal to each pixel PX through a data line DL. Although not shown, the data driving circuit may be arranged in the third adjacent area AA3 or the pad area PADA. Alternatively, the data driving circuit may be arranged on a display circuit board connected to the display panel 10 through the pad.

Figure 4A:
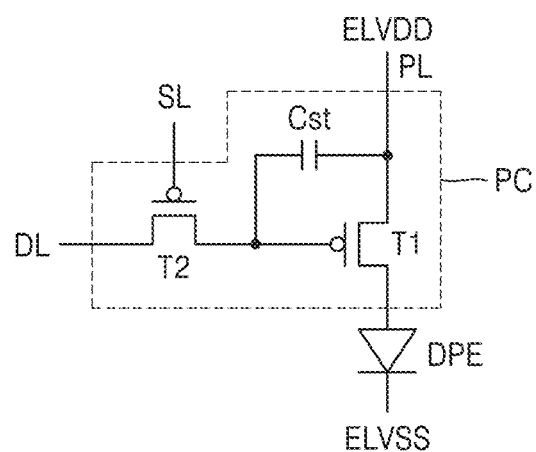
FIGS. 4A and 4B area schematic equivalent circuit diagrams of a pixel circuit which may be applied to a display panel.
Figure 4B:
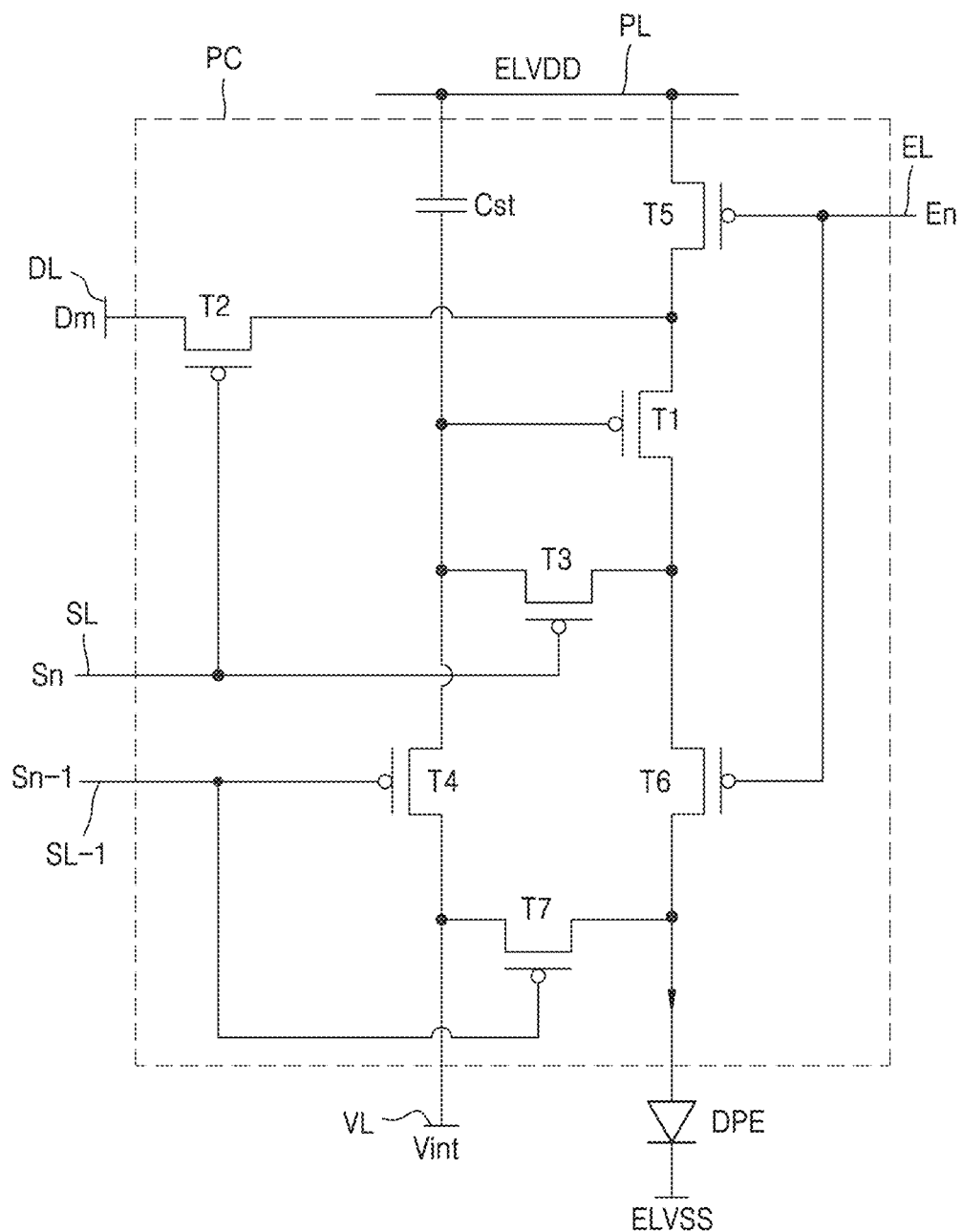

FIGS. 4A and 4B area schematic equivalent circuit diagrams of a pixel circuit PC which may be implemented in a display panel.

Referring to FIG. 4A, the pixel circuit PC may be electrically connected to a display element DPE. The pixel circuit PC may include a driving thin-film transistor T1, a switching thin-film transistor T2, and a storage capacitor Cst. According to an embodiment, the display element DPE may emit red, green, or blue light or red, green, blue, or white light.

The switching thin-film transistor T2 may be connected to a scan line SL and a data line DL and may be configured to transmit a data signal Dm provided through the data line DL, to the driving thin-film transistor T1, in response to a scan signal Sn provided through the scan line SL.

The storage capacitor Cst may be connected to the switching thin-film transistor T2 and a driving voltage line PL and may be configured to store a voltage corresponding to a difference between a voltage received from the switching thin-film transistor T2 and a first power voltage ELVDD supplied to the driving voltage line PL.

The driving thin film transistor T1 may be connected to the driving voltage line PL and the storage capacitor Cst and may control a driving current flowing from the driving voltage line PL through the display element DPE, in correspondence with a value of the voltage stored in the storage capacitor Cst. The display element DPE may emit light having a predetermined brightness according to the driving current. An opposite electrode of the display element DPE may receive a second power voltage ELVSS.

FIG. 4A illustrates that the pixel circuit PC includes two thin-film transistors and one storage capacitor. However, the pixel circuit PC may include more thin-film transistors than the thin-film transistors illustrated in FIG. 4A.

Referring to FIG. 4B, the pixel circuit PC may include the driving thin-film transistor T1, the switching thin-film transistor T2, a compensation thin-film transistor T3, a first initialization thin-film transistor T4, an operation control thin-film transistor T5, an emission control thin-film transistor T6, and a second initialization thin-film transistor T7.

FIG. 4B illustrates that each pixel circuit PC includes a scan line SL, a previous scan line SL−1, an emission control line EL, a data line DL, an initialization voltage line VL, and a driving voltage line PL. However, according to another embodiment, at least one of the scan line SL, the previous scan line SL−1, the emission control line EL, the data line DL, and the initialization voltage line VL may be shared by adjacent pixel circuits.

A driving drain electrode of the driving thin-film transistor T1 may be electrically connected to the display element DPE through the emission control thin-film transistor T6. The driving thin-film transistor T1 may be configured to receive a data signal Dm according to a switching operation of the switching thin-film transistor T2 and supply a driving current to the display element DPE.

A switching gate electrode of the switching thin-film transistor T2 may be connected to the scan line SL, and a switching source electrode of the switching thin-film transistor T2 may be connected to the data line DL. A switching drain electrode of the switching thin-film transistor T2 may be connected to a driving source electrode of the driving thin-film transistor T1 and may be connected to the driving voltage line PL through the operation control thin-film transistor T5.

The switching thin-film transistor T2 may be turned on in response to a scan signal Sn transmitted through the scan line SL and may be configured to perform a switching operation of transmitting a data signal Dm transmitted through the data line DL to the driving source electrode of the driving thin-film transistor T1.

A compensation gate electrode of the compensation thin-film transistor T3 may be connected to the scan line SL. A compensation source electrode of the compensation thin-film transistor T3 may be connected to the driving drain electrode of the driving thin-film transistor T1 and may be connected to a pixel electrode of the display element DPE through the emission control thin-film transistor T6. A compensation drain electrode of the compensation thin-film transistor T3 may be connected to an electrode of the storage capacitor Cst, a first initialization source electrode of the first initialization thin-film transistor T4, and a driving gate electrode of the driving thin-film transistor T1. The compensation thin-film transistor T3 may be turned on in response to a scan signal Sn transmitted through the scan line SL and may be configured to connect the driving gate electrode of the driving thin-film transistor T1 with the driving drain electrode of the driving thin-film transistor T1 to diode-connect the driving thin-film transistor T1.

A first initialization gate electrode of the first initialization thin-film transistor T4 may be connected to the previous scan line SL−1. A first initialization drain electrode of the first initialization thin-film transistor T4 may be connected to the initialization voltage line VL. A first initialization source electrode of the first initialization thin-film transistor T4 may be connected to any one electrode of the storage capacitor Cst, the compensation drain electrode of the compensation thin-film transistor T3, and the driving gate electrode of the driving thin-film transistor T1. The first initialization thin-film transistor T4 may be turned on in response to a previous scan signal Sn−1 received through the previous scan line SL−1 and may be configured to perform an initialization operation of initializing a voltage of the driving gate electrode of the driving thin-film transistor T1 by transmitting an initialization voltage Vint to the driving gate electrode of the driving thin-film transistor T1.

An operation control gate electrode of the operation control thin-film transistor T5 may be connected to the emission control line EL. An operation control source electrode of the operation control thin-film transistor T5 may be connected to the driving voltage line PL. An operation control drain electrode of the operation control thin-film transistor T5 may be connected to the driving source electrode of the driving thin-film transistor T1 and the switching drain electrode of the switching thin-film transistor T2.

An emission control gate electrode of the emission control thin-film transistor T6 may be connected to the emission control line EL. An emission control source electrode of the emission control thin-film transistor T6 may be connected to the driving drain electrode of the driving thin-film transistor T1 and the compensation source electrode of the compensation thin-film transistor T3. An emission control drain electrode of the emission control thin-film transistor T6 may be electrically connected to the pixel electrode of the display element DPE. The operation control thin-film transistor T5 and the emission control thin-film transistor T6 may be simultaneously turned on in response to an emission control signal En received through the emission control line EL, and thus, the first power voltage ELVDD may be transmitted to the display element DPE and a driving current may flow in the display element DPE.

A second initialization gate electrode of the second initialization thin-film transistor T7 may be connected to the previous scan line SL−1. A second initialization source electrode of the second initialization thin-film transistor T7 may be connected to the pixel electrode of the display element DPE. A second initialization drain electrode of the second initialization thin-film transistor T7 may be connected to the initialization voltage line VL. The second initialization thin-film transistor T7 may be turned on in response to a previous scan signal Sn−1 received through the previous scan line SL−1 and may be configured to initialize the pixel electrode of the display element DPE.

FIG. 4B illustrates that both of the first initialization thin-film transistor T4 and the second initialization thin-film transistor T7 are connected to the previous scan line SL−1. However, according to another embodiment, the first initialization thin-film transistor T4 and the second initialization thin-film transistor T7 may be connected to the previous scan line SL−1 and a next scan line (not shown), respectively, and the first initialization thin-film transistor T4 and the second initialization thin-film transistor T7 may be driven in response to a previous scan signal Sn−1 and a next scan signal, respectively.

The other electrode of the storage capacitor Cst may be connected to the driving voltage line PL. The electrode of the storage capacitor Cst may be connected to the driving gate electrode of the driving thin-film transistor T1, the compensation drain electrode of the compensation thin-film transistor T3, and the first initialization source electrode of the first initialization thin-film transistor T4.

The opposite electrode (for example, a cathode) of the display element DPE may receive the second power voltage ELVSS. The display element DPE may emit light by receiving the driving current from the driving thin-film transistor T1.

Figure 5:
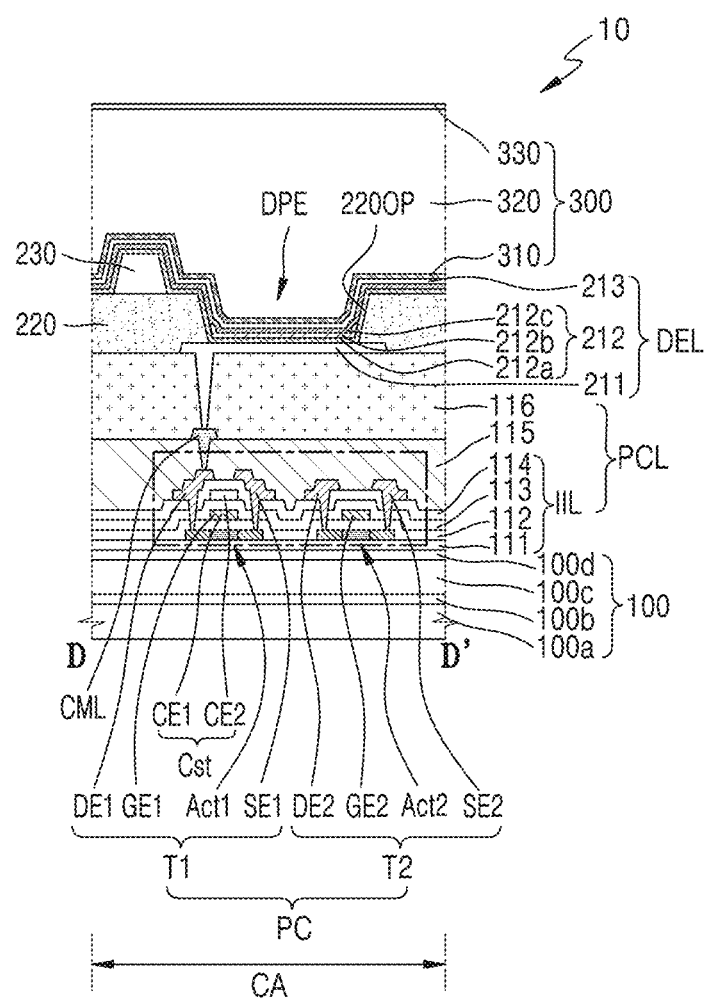
FIG. 5 is a schematic cross-sectional view of the display panel of FIG. 3, taken along line D-D'.

FIG. 5 is a schematic cross-sectional view of the display panel 10 of FIG. 3, taken along line D-D'.

Referring to FIG. 5, the display panel 10 may include the substrate 100, a pixel circuit layer PCL, a display element layer DEL, and an encapsulation layer 300. The substrate 100 may include the center area CA. According to an embodiment, the substrate 100 may include a first base layer 100a, a first barrier layer 100b, a second base layer 100c, and a second barrier layer 100d. According to an embodiment, the first base layer 100a, the first barrier layer 100b, the second base layer 100c, and the second barrier layer 100d may be sequentially stacked in the substrate 100 in this stated order. According to another embodiment, the substrate 100 may include glass.

At least one of the first base layer 100a and the second base layer 100c may include polymer resins, such as polyethersulfone, polyarylate, polyetherimide, polyethylene naphthalate, polyethylene terephthalate, polyphenylene sulfide, polyimide, polycarbonate, cellulose tri acetate, or cellulose acetate propionate.

The first barrier layer 100b and the second barrier layer 100d may prevent the penetration of external impurities and may include a single layer or layers including an inorganic material, such as silicon nitride ($SiN_x$), silicon oxide ($SiO_2$), and/or silicon oxynitride (SiON).

The pixel circuit layer PCL may be arranged on the substrate 100. The pixel circuit layer PCL may include the pixel circuit PC. The pixel circuit PC may be arranged on the center area CA. The pixel circuit PC may include the driving thin-film transistor T1, the switching thin-film transistor T2, and the storage capacitor Cst. According to an embodiment, the driving thin-film transistor T1 may include a first semiconductor layer Act1, a first gate electrode GE1, a first source electrode SE1, and a first drain electrode DE1. According to an embodiment, the switching thin-film transistor T2 may include a second semiconductor layer Act2, a second gate electrode GE2, a second source electrode SE2, and a second drain electrode DE2. The second semiconductor layer Act2, the second gate electrode GE2, the second source electrode SE2, and the second drain electrode DE2 may be substantially the same as the first semiconductor layer Act1, the first gate electrode GE1, the first source electrode SE1, and the first drain electrode DE1, respectively, and thus, are not described in detail.

The pixel circuit layer PCL may further include an inorganic insulating layer IIL, a first insulating layer 115, and a second insulating layer 116 arranged below and/or above components of the pixel circuit PC. The inorganic insulating layer IIL may include a buffer layer 111, a first gate insulating layer 112, a second gate insulating layer 113, and an interlayer insulating layer 114.

The buffer layer 111 may be arranged on the substrate 100. The buffer layer 111 may include an inorganic insulating material, such as $SiN_x$, SiON, and $SiO_2$, and may include a single layer or layers including the inorganic insulating materials described above.

The first semiconductor layer Act1 may be arranged on the buffer layer 111. The first semiconductor layer Act1 may include polysilicon. Alternatively, the first semiconductor layer Act1 may include amorphous silicon, an oxide semiconductor, or an organic semiconductor. The first semiconductor layer Act1 may include a channel area, a drain area and a source area arranged at both sides of the channel area, respectively.

The first gate electrode GE1 may overlap the channel area in a plan view. The first gate electrode GE1 may include a low-resistance metal material. The first gate electrode GE1 may include a conductive material including Mo, Al, Cu, Ti, etc. and may include layers or a single layer including the conductive materials described above.

The first gate insulating layer 112 between the first semiconductor layer Act1 and the first gate electrode GE1 may include an inorganic insulating material, such as $SiO_2$, $SiN_x$, SiON, $Al_2O_3$, $TiO_2$, $Ta_2O_5$, $HfO_2$, and/or $ZnO_x$. According to an embodiment, ZnO may include ZnO and/or $ZnO_2$.

The second gate insulating layer 113 may cover the first gate electrode GE1. The second gate insulating layer 113 may include an inorganic insulating material, such as $SiO_2$, $SiN_x$, SiON, $Al_2O_3$, $TiO_2$, $Ta_2O_5$, $HfO_2$, and/or $ZnO_x$, similar to the first gate insulating layer 112.

An upper electrode CE2 of the storage capacitor Cst may be arranged above the second gate insulating layer 113. The upper electrode CE2 may overlap the first gate electrode GE1 therebelow in a plan view. Here, the storage capacitor Cst may include the first gate electrode GE1 of the driving thin-film transistor T1 and the upper electrode CE2, the first gate electrode GE1 and the upper electrode CE2 overlapping each other with the second gate insulating layer 113 therebetween. That is, the first gate electrode GE1 of the driving thin-film transistor T1 may function as a lower electrode CE1 of the storage capacitor Cst. In other words, the storage capacitor Cst and the driving thin-film transistor T1 may overlap each other in a plan view. In some embodiments, the storage capacitor Cst may not overlap the driving thin-film transistor T1 in a plan view. The upper electrode CE2 may include Al, Pt, Pd, Ag, Mg, Au, Ni, Nd, Ir, Cr, Ca, Mo, Ti, W, and/or Cu and may include a single layer or layers including the materials described above.

The interlayer insulating layer 114 may cover the upper electrode CE2. The interlayer insulating layer 114 may include $SiO_2$, $SiN_x$, SiON, $Al_2O_3$, $TiO_2$, $Ta_2O_5$, $HfO_2$, $ZnO_x$, or the like. The interlayer insulating layer 114 may include a single layer or layers including the inorganic insulating materials described above.

Each of the first drain electrode DE1 and the first source electrode SE1 may be arranged on the interlayer insulating layer 114. The first drain electrode DE1 and the first source electrode SE1 may include a highly conductive material. The first drain electrode DE1 and the first source electrode SE1 may include a conductive material including Mo, Al, Cu, Ti, etc. and may include layers or a single layer including the materials described above. According to an embodiment, the first drain electrode DE1 and the first source electrode SE1 may have a multi-layered structure of Ti/Al/Ti.

The first insulating layer 115 may be arranged on the first drain electrode DE1, the first source electrode SE1, the second drain electrode DE2, the second source electrode SE2, and the interlayer insulating layer 114. According to an embodiment, the first insulating layer 115 may include an organic material. For example, the first insulating layer 115 may include an organic insulating material, such as a general-purpose polymer such as polymethylmethacrylate ("PMMA") or polystyrene ("PS"), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

A connection electrode CML may be arranged on the first insulating layer 115. The connection electrode CML may be electrically connected to the pixel circuit PC through a hole of the first insulating layer 115. According to an embodiment, the connection electrode CML may be electrically connected to the first drain electrode DE1 or the first source electrode SE1. The connection electrode CML may include a highly conductive material. The connection electrode CML may include a conductive material including Mo, Al, Cu, Ti, etc. and may include layers or a single layer including the conductive materials described above. According to an embodiment, the connection electrode CML may have a multi-layered structure of Ti/Al/Ti.

The second insulating layer 116 may be arranged on the first insulating layer 115 and the connection electrode CML. According to an embodiment, the second insulating layer 116 may include an organic material. The second insulating layer 116 may include an organic insulating material, such as a general-purpose polymer such as PMMA or PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The display element layer DEL may be arranged on the pixel circuit layer PCL. The display element layer DEL may include the display element DPE, a pixel-defining layer 220 and a spacer 230. According to an embodiment, the display element DPE may include an organic light-emitting diode. The display element DPE may be electrically connected to the connection electrode CML through a hole of the second insulating layer 116. The display element DPE may include a pixel electrode 211, an intermediate layer 212, and an opposite electrode 213. According to an embodiment, the display element DPE arranged in the center area CA may overlap the pixel circuit PC arranged in the center area CA in a plan view.

The pixel electrode 211 may be arranged on the second insulating layer 116. The pixel electrode 211 may be electrically connected to the connection electrode CML through the hole of the second insulating layer 116. The pixel electrode 211 may include a conductive oxide, such as indium tin oxide ("ITO"), indium zinc oxide ("IZO"), ZnO, indium oxide ($In_2O_3$), indium gallium oxide ("IGO"), or aluminum zinc oxide ("AZO"). According to another embodiment, the pixel electrode 211 may include a reflective layer including Ag, Mg, Al, Pt, Pd, Au, Ni, Nd, Ir, Cr, or a compound thereof. According to another embodiment, the pixel electrode 211 may further include a layer including ITO, IZO, ZnO, or $In_2O_3$, above/below the reflective layer described above.

The pixel-defining layer 220 may define an opening 220OP exposing a central portion of the pixel electrode 211 and may be arranged on the pixel electrode 211. The opening 220OP may define an emission area of light emitted from the display element DPE. For example, a width of the opening 220OP may correspond to a width of the emission area. Also, the width of the opening 220OP may correspond to a width of a sub-pixel in a plan view.

According to an embodiment, the pixel-defining layer 220 may include an organic insulating material. According to another embodiment, the pixel-defining layer 220 may include an inorganic insulating material, such as $SiN_x$, SiON, or $SiO_2$. According to another embodiment, the pixel-defining layer 220 may include an organic insulating material and an inorganic insulating material. In some embodiments, the pixel-defining layer 220 may include a light-shielding material and may be provided in a black color. The light-shielding material may include a resin or paste including carbon black, a carbon nano-tube, and a black dye, a metal particle, such as Ni, Al, Mo, and an alloy thereof, a metal oxide particle (for example, chromium oxide), a metal nitride particle (for example, chromium nitride), or the like. When the pixel-defining layer 220 includes a light-shielding material, reflection of external light due to metal structures arranged below the pixel-defining layer 220 may be reduced.

The spacer 230 may be arranged on the pixel-defining layer 220. The spacer 230 may be provided to prevent the substrate 100 and/or the layers on the substrate 100 from being damaged according to a method of manufacturing a display apparatus. According to a method of manufacturing the display panel 10, a mask sheet may be used. Here, the mask sheet may be introduced into the opening 220OP of the pixel-defining layer 220 or may adhere to the pixel-defining layer 220. The spacer 230 may prevent or reduce the damage or fracture defects of the substrate 100 and one or more of the layers due to the mask sheet when a deposition material is deposited on the substrate 100.

The spacer 230 may include an organic material such as polyimide. Alternatively, the spacer 230 may include an inorganic insulating material, such as $SiN_x$ or $SiO_2$, or may include an organic insulating material and an inorganic insulating material. According to an embodiment, the spacer 230 may include a different material from the pixel-defining layer 220. Alternatively, according to another embodiment, the spacer 230 may include the same material as the pixel-defining layer 220, and in this case, the pixel-defining layer 220 and the spacer 230 may be formed together by a mask process using a halftone mask, etc.

The intermediate layer 212 may be arranged on the pixel-defining layer 220. The intermediate layer 212 may include an emission layer 212b arranged in the opening 220OP of the pixel-defining layer 220. The emission layer 212b may include a high molecular-weight or low molecular-weight organic material emitting a predetermined color of light.

The intermediate layer 212 may further include at least one of a first functional layer 212a between the pixel electrode 211 and the emission layer 212b and a second functional layer 212c between the emission layer 212b and the opposite electrode 213. According to an embodiment, the first functional layer 212a and the second functional layer 212c may be arranged below and above the emission layer 212b, respectively. The first functional layer 212a may include, for example, a hole transport layer ("HTL"), or an HTL and a hole injection layer ("HIL"). The second functional layer 212c may include an electron transport layer ("ETL") and/or an electron injection layer ("EIL"). The first functional layer 212a and/or the second functional layer 212c may be a common layer formed to entirely cover the substrate 100, like the opposite electrode 213 to be described below.

The opposite electrode 213 may be arranged on the intermediate layer 212. The opposite electrode 213 may include a conductive material having a low work function. For example, the opposite electrode 213 may include a (semi) transparent layer including Ag, Mg, Al, Pt, Pd, Au, Ni, Nd, Ir, Cr, Li, Ca, or an alloy thereof. Alternatively, the opposite electrode 213 may further include a layer including ITO, IZO, ZnO, or $In_2O_3$ on the (semi) transparent layer including the materials described above.

In some embodiments, a capping layer (not shown) may further be arranged on the opposite electrode 213. The capping layer may include LiF, an inorganic material, or/and an organic material.

The encapsulation layer 300 may be arranged on the opposite electrode 213. According to an embodiment, the encapsulation layer 300 may include at least one inorganic encapsulation layer and at least one organic encapsulation layer. According to an embodiment, the encapsulation layer 300 may include a first inorganic encapsulation layer 310, an organic encapsulation layer 320, and a second inorganic encapsulation layer 330 that are sequentially stacked.

The first inorganic encapsulation layer 310 and the second inorganic encapsulation layer 330 may include one or more inorganic materials from among $Al_2O_3$, $TiO_2$, $Ta_2O_5$, $HfO_2$, $ZnO_x$, $SiO_2$, $SiN_x$, and SiON. The organic encapsulation layer 320 may include a polymer-based material. The polymer-based material may include acryl-based resins, epoxy-based resins, polyimide, polyethylene, etc. According to an embodiment, the organic encapsulation layer 320 may include acrylate.

A touch sensor layer may be arranged on the encapsulation layer 300. The touch sensor layer may obtain coordinate information based on an external input, for example, a touch event.

A reflection prevention layer may be arranged on the touch sensor layer. The reflection prevention layer may reduce the reflectivity of light that is incident toward the display panel 10. According to an embodiment, the reflection prevention layer may include a phase retarder and a polarizer. The phase retarder may include a film-type phase retarder or a liquid crystal coating-type phase retarder, and may include a λ/2 phase retarder and/or a λ/4 phase retarder. The polarizer may also include a film-type polarizer or a liquid crystal coating-type polarizer. The film-type polarizer may include an elongation-type synthetic resin film, and the liquid crystal coating-type polarizer may include liquid crystals arranged in a certain shape. The phase retarder and the polarizer may further include a protective film.

According to another embodiment, the reflection prevention layer may include a black matrix and color filters. The color filters may be arranged by taking into account a color of light emitted from each of the plurality of display elements DPE in the display panel 10. Each of the color filters may include a red, green, or blue pigment or dye. Alternatively, each of the color filters may further include quantum dots, in addition to the pigment or the dye described above. Alternatively, some of the color filters may not include the pigment or the dye described above and may include scattered particles, such as oxide titanium.

According to another embodiment, the reflection prevention layer may include a destructive interference structure. The destructive interference structure may include a first reflective layer and a second reflective layer arranged in different layers from each other. First reflective light and second reflective light reflected from the first reflective layer and the second reflective layer, respectively, may destructively interfere, and thus, the reflectivity of external light may be decreased.

Figure 6:
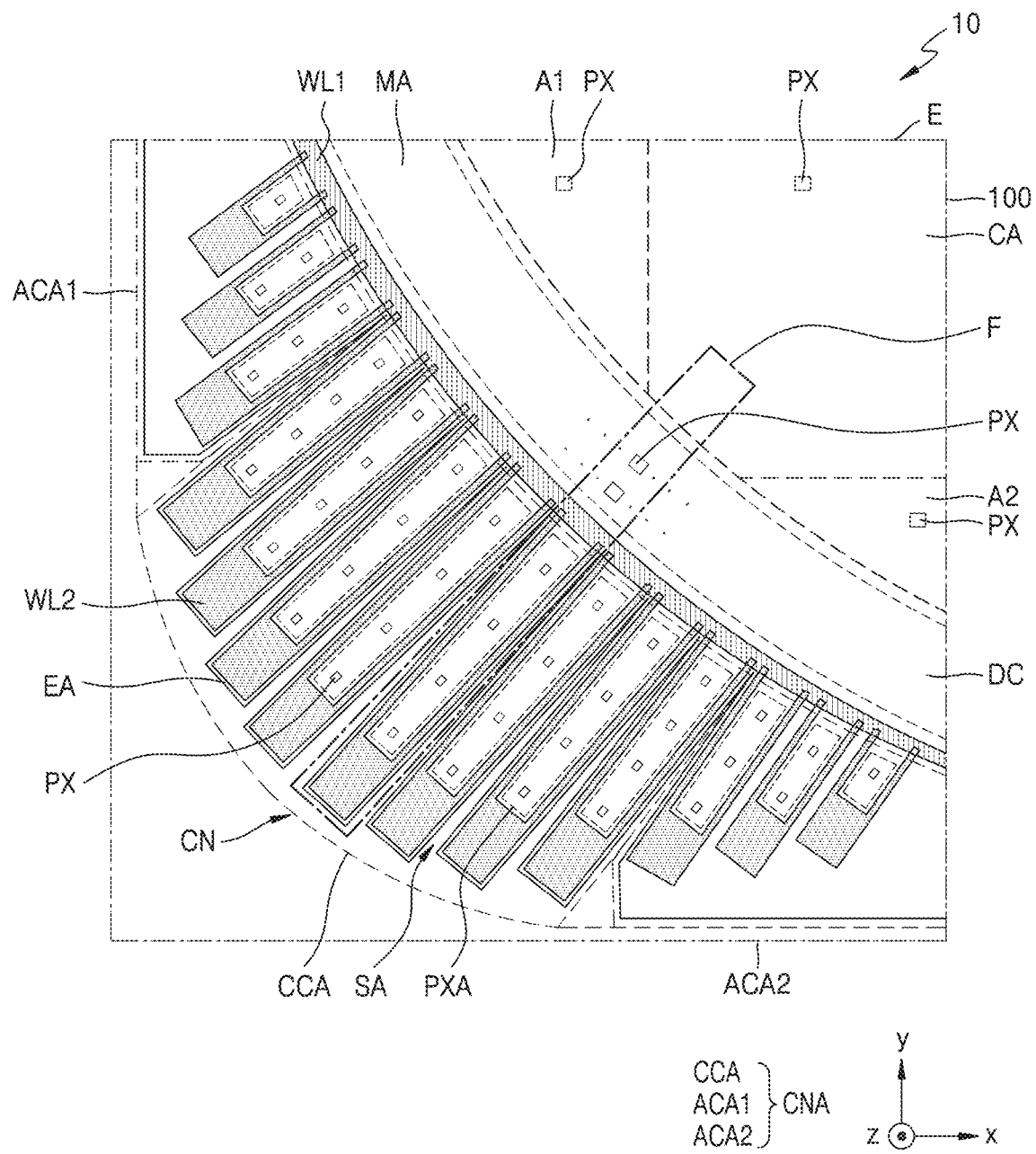
FIG. 6 is an enlarged view of a region E of the display panel of FIG. 3.

FIG. 6 is an enlarged view of a region E of the display panel 10 of FIG. 3.

Referring to FIG. 6, the display panel 10 may include the substrate 100, the pixel PX, a first line WL1, a second line WL2, and the driving circuit DC. The substrate 100 may include the center area CA, the first area A1, the second area A2, the corner area CNA, and the middle area MA.

The first area A1 may be adjacent to the center area CA in the first direction (for example, the x direction or the −x direction). The first area A1 may extend in the second direction (for example, the y direction or the −y direction). The second area A2 may be adjacent to the center area CA in the second direction (for example, the y direction or the −y direction). The second area A2 may extend in the first direction (for example, the x direction or the −x direction).

The corner area CNA may be an area arranged at the corner CN of the display panel 10. According to an embodiment, the corner area CNA may be an area at which an edge of the display panel 10 in the first direction (for example, the x direction or the −x direction) and an edge of the display panel 10 in the second direction (for example, the y direction or the −y direction) meet each other. According to an embodiment, the corner area CNA may at least partially surround the center area CA, the first area A1, the second area A2, and the middle area MA. The corner area CNA may include a central corner area CCA, a first adjacent corner area ACA1, and a second adjacent corner area ACA2.

The central corner area CCA may include an extension area EA. The extension area EA may extend in a direction away from the center area CA. According to an embodiment, the extension area EA may be provided in a multiple number. Each of the plurality of extension areas EA may extend in the direction away from the center area CA. According to an embodiment, the plurality of extension areas EA may extend in directions crossing the first direction (for example, the x direction or the −x direction) and the second direction (for example, the y direction or the −y direction), respectively.

A space area SA may be defined between an adjacent pair of the plurality of extension areas EA. The space area SA may be an area, in which components of the display panel 10 are not arranged. When the central corner area CCA bends at the corner CN, a compressive strain occurring in the central corner area CCA may be greater than a tensile strain occurring in the central corner area CCA. According to the present embodiment, because the space area SA may be defined between the adjacent extension areas EA, the central corner area CCA may easily contract. Thus, the display panel 10 may bend at the central corner area CCA without being damaged.

The first adjacent corner area ACA1 may be adjacent to the central corner area CCA. According to an embodiment, at least a portion of the first area A1 and the first adjacent corner area ACA1 may be arranged in the first direction (for example, the x direction or the −x direction). An end of the central corner area CCA and an end of the first adjacent corner area ACA1 may be spaced apart from each other. The central corner area CCA and the first adjacent corner area ACA1 may be adjacent to each other. The first adjacent corner area ACA1 may be bent on the cross-section (for example, the x-z section) in the first direction (for example, the x direction or the −x direction) and may not be bent on the cross-section (for example, the y-z section) in the second direction (for example, the y direction or the −y direction). The space area SA may not be defined in the first adjacent corner area ACA1 in another embodiment.

The second adjacent corner area ACA2 may be adjacent to the central corner area CCA. At least a portion of the second area A2 may be arranged between the center area CA and the second adjacent corner area ACA2 in the second direction (for example, the y direction or the −y direction). An end of the central corner area CCA and an end of the second adjacent corner area ACA2 may be spaced apart from each other. The central corner area CCA and the second adjacent corner area ACA2 may be adjacent to each other. The second adjacent corner area ACA2 may not be bent on the cross-section (for example, the x-z section) in the first direction (for example, the x direction or the −x direction) and may be bent on the cross-section (for example, the y-z section) in the second direction (for example, the y direction or the −y direction). The space area SA may not be defined in the second adjacent corner area ACA2 in another embodiment.

The middle area MA may be arranged between the center area CA and the corner area CNA. According to an embodiment, the middle area MA may extend between the center area CA and the first adjacent corner area ACA1. The middle area MA may extend between the center area CA and the second adjacent corner area ACA2. According to an embodiment, the middle area MA may at least partially surround the center area CA, the first area A1, and the second area A2.

The plurality of pixels PX may be arranged in the center area CA, the first area A1, the second area A2, the corner area CNA, and the middle area MA. Thus, the display panel 10 may display an image in the center area CA, the first area A1, the second area A2, the corner area CNA, and the middle area MA. According to an embodiment, each of the plurality of extension areas EA may include a pixel area PXA, and the pixels PX may be arranged in the pixel areas PXA. The plurality of pixels PX may be arranged in an extension direction of the plurality of extension areas EA. The pixel PX may include a display element.

The first line WL1 may be arranged in the middle area MA. According to an embodiment, the first line WL1 may extend in an extension direction of the middle area MA. The first line WL1 may extend to at least partially surround the center area CA, the first area A1, and the second area A2. The first line WL1 may be a power line configured to supply the second power voltage ELVSS (see FIG. 4A).

The second line WL2 may be electrically connected to the first line WL1. According to an embodiment, the second line WL2 may be arranged in a different layer from the first line WL1. For example, the second line WL2 may be arranged on the first insulating layer 115, and the first line WL1 may be arranged below the first insulating layer 115. In this case, the second line WL2 and the first line WL1 may be electrically connected to each other through a contact hole (i.e., CNT1) of the first insulating layer 115. Thus, the second line WL2 may be a power line configured to supply the second power voltage ELVSS (see FIG. 4A).

The second line WL2 may extend from the middle area MA to the corner area CNA. According to an embodiment, the second line WL2 may extend from the middle area MA to the extension area EA. The second line WL2 may have a shape having an open end. That is, the "open end" is an end not connected to another component. The shape having the open end may be aligned in a direction toward the center area CA.

The second line WL2 may be provided in a multiple number. The plurality of second lines WL2 may be arranged in the corner area CNA. The plurality of second lines WL2 may be arranged in the central corner area CCA, the first adjacent corner area ACA1, and the second adjacent corner area ACA2. According to an embodiment, each of the plurality of second lines WL2 may be arranged in the extension area EA.

The driving circuit DC may be arranged in the middle area MA. The driving circuit DC may be provided in a multiple number. The plurality of driving circuits DC may be arranged in the extension direction of the middle area MA. The plurality of driving circuits DC may be arranged to at least partially surround the center area CA, the first area A1, and the second area A2. According to an embodiment, the driving circuit DC may be configured to supply a scan signal through a scan line. According to another embodiment, the driving circuit DC may be configured to supply a previous scan signal through a previous scan line. According to another embodiment, the driving circuit DC may be configured to supply an emission control signal through an emission control line.

The plurality of pixels PX may be arranged in the middle area MA. According to an embodiment, at least one of the first line WL1 and the driving circuit DC may overlap the plurality of pixels PX in a plan view. Thus, even when the first line WL1 and the driving circuits DC are arranged in the middle area MA, the display panel 10 may display an image in the middle area MA.

Figure 7A:
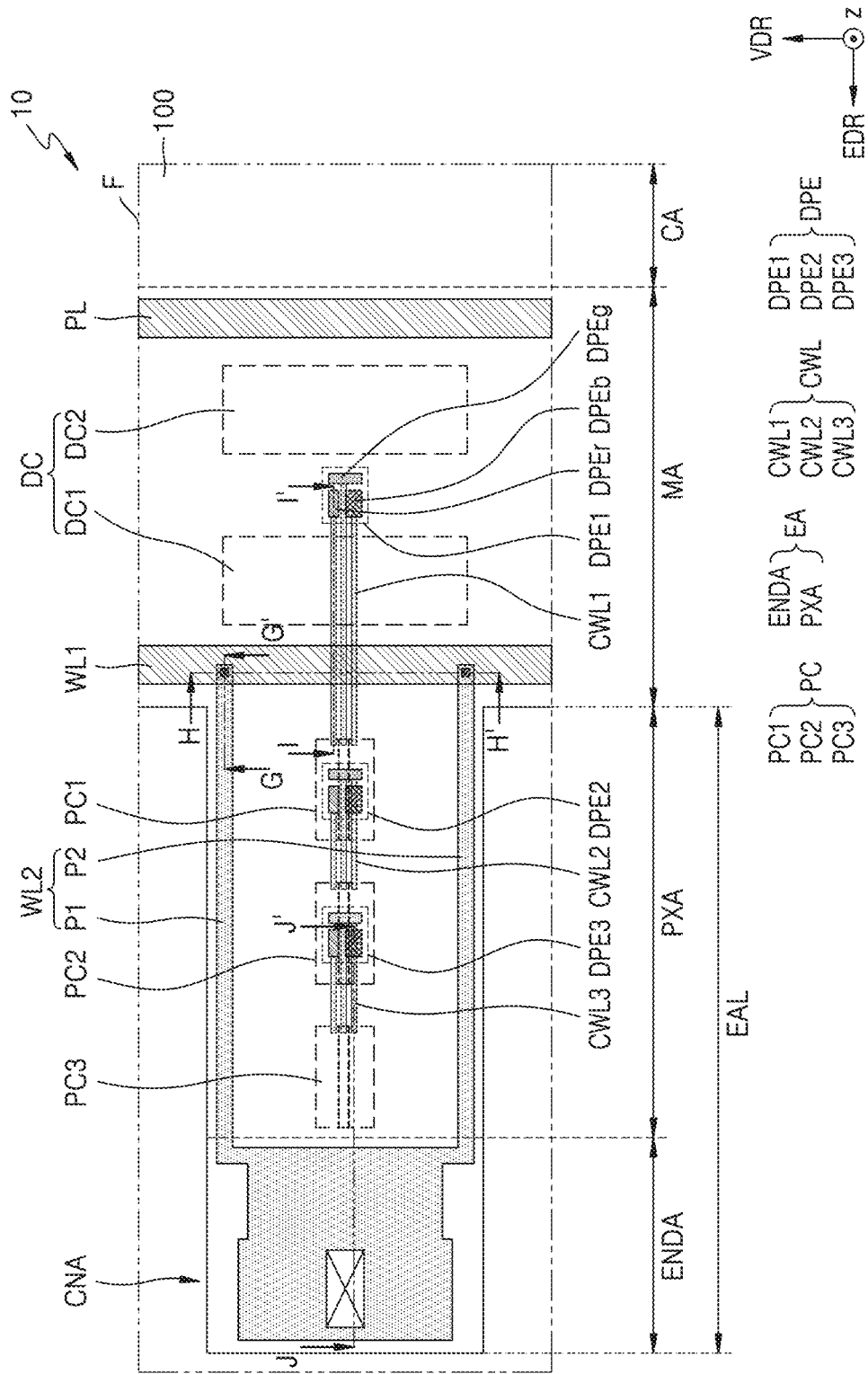
FIGS. 7A and 7B are enlarged schematic plan views of a region F of a display panel of FIG. 6, according to an embodiment.
Figure 7B:
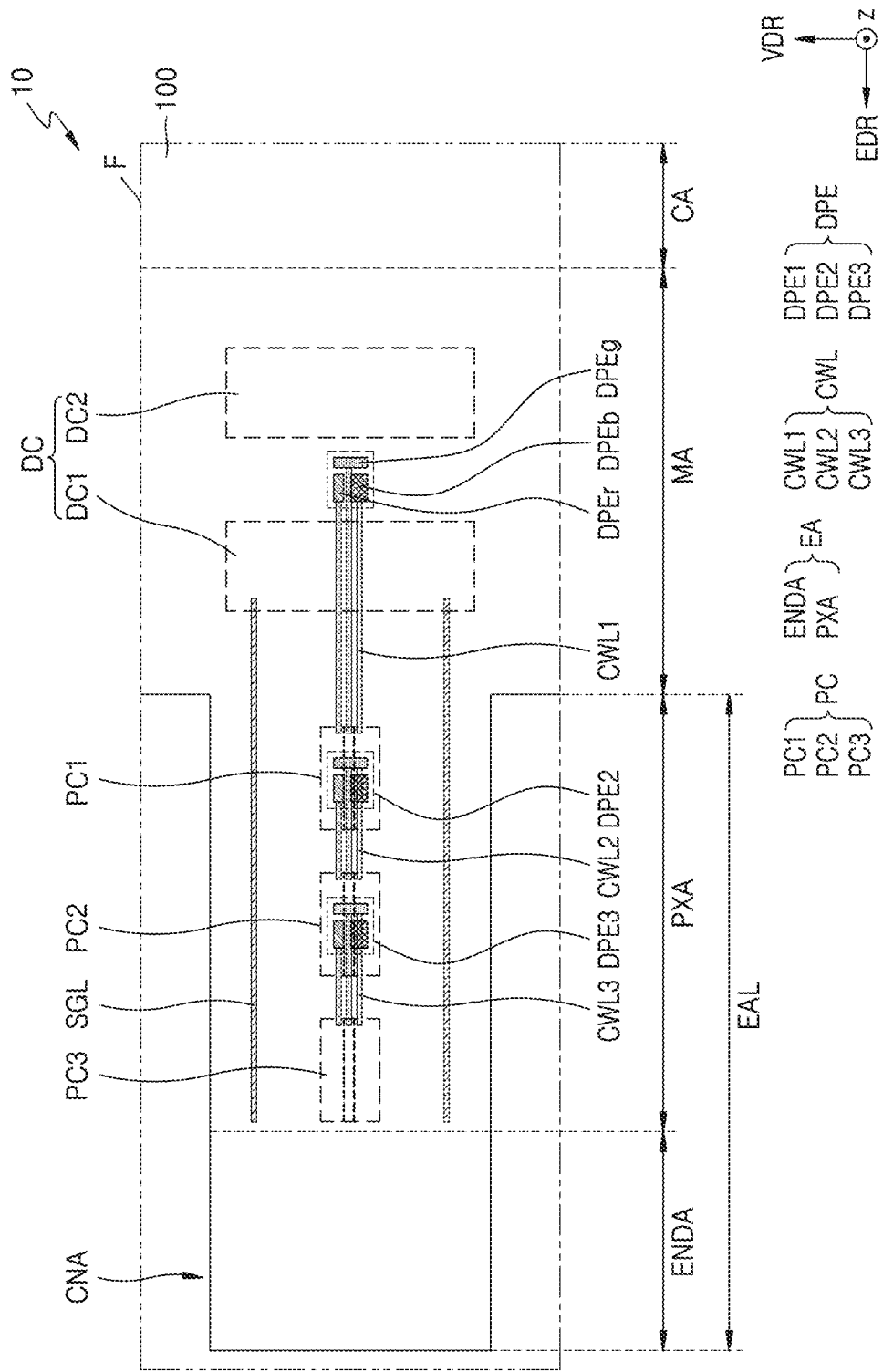

FIGS. 7A and 7B are enlarged schematic plan views of a region F of the display panel 10 of FIG. 6, according to an embodiment.

Referring to FIGS. 7A and 7B, the display panel 10 may include the substrate 100, the first line WL1, the second line WL2, the pixel circuit PC, the driving circuit DC, a signal line SGL, a connection line CWL, the driving voltage line PL, and the display element DPE. The substrate 100 may include the center area CA, the corner area CNA, and the middle area MA.

The corner area CNA may include the extension area EA. According to an embodiment, the corner area CNA may be provided in a multiple number, and a space area SA may be defined between an adjacent pair of the extension areas EA. A longitudinal direction of the extension area EA may be defined as an "extension direction" EDR. The extension directions EDR of the extension areas EA may be different from each other as shown in FIG. 6. The extension area EA may extend in the extension direction EDR. According to an embodiment, the extension direction EDR may be a direction crossing the first direction and/or the second direction. The extension area EA may include the pixel area PXA and an end area ENDA. The pixel area PXA may be arranged between the end area ENDA and the middle area MA. The end area ENDA may be arranged outside the pixel area PXA. The end area ENDA may be an end of the extension area EA opposite to the middle area MA.

The middle area MA may be arranged between the center area CA and the corner area CNA.

The first line WL1 may be arranged in the middle area MA. According to an embodiment, the first line WL1 may extend in an extension direction of the middle area MA. According to an embodiment, the first line WL1 may be arranged to be adjacent to the corner area CNA and may extend along an edge of the middle area MA. The first line WL1 may be a power line configured to supply the second power voltage ELVSS (see FIG. 4A).

The second line WL2 may be electrically connected to the first line WL1. According to an embodiment, the second line WL2 may be arranged in a different layer from the first line WL1. For example, the second line WL2 may be arranged on the first insulating layer 115, and the first line WL1 may be arranged below the first insulating layer 115 (See FIG. 10). In this case, the second line WL2 and the first line WL1 may be electrically connected to each other through a contact hole CNT1 of the first insulating layer 115. Thus, the second line WL2 may be a power line configured to supply the second power voltage ELVSS (see FIG. 4A).

The second line WL2 may include a first portion P1 and a second portion P2. The first portion P1 and the second portion P2 may extend from the middle area MA to the extension area EA. The first portion P1 and the second portion P2 may be spaced apart from each other in the middle area MA. Each of the first portion P1 and the second portion P2 may be adjacent to a side of the extension area EA. For example, the first portion P1 may be adjacent to a first side of the extension area EA, and the second portion P2 may be adjacent to a second side of the extension area EA. The first side and the second side of the extension area EA may face each other in the vertical direction VDR and define different space areas SA from each other.

The first portion P1 and the second portion P2 may meet each other in the end area ENDA to be integrally provided. Thus, the second line WL2 may have a shape having an open end. The shape having the open end may be aligned in a direction toward the center area CA. The first portion P1 and the second portion P2 may meet each other in the end area ENDA, and thus, the second line WL2 may maintain a low resistance.

The pixel circuit PC may be arranged on the substrate 100. According to an embodiment, the pixel circuit PC may be arranged in the pixel area PXA. Although not shown, the pixel circuit PC may also be arranged in the center area CA. According to an embodiment, the pixel circuit PC may include a first pixel circuit PC1, a second pixel circuit PC2, and a third pixel circuit PC3.

The first pixel circuit PC1 may be electrically connected to the display element DPE arranged in the middle area MA. Thus, the first pixel circuit PC1 may drive the display element DPE arranged in the middle area MA. The first pixel circuit PC1 may be arranged in the extension area EA. In particular, the first pixel circuit PC1 may be arranged in the pixel area PXA of the extension area EA.

The second pixel circuit PC2 may be electrically connected to the display element DPE arranged in the extension area EA. Thus, the second pixel circuit PC2 may drive the display element DPE arranged in the extension area EA. The second pixel circuit PC2 may be arranged in the extension area EA. In particular, the second pixel circuit PC2 may be arranged in the pixel area PXA of the extension area EA. According to an embodiment, the second pixel circuit PC2 may be arranged to be farther from the middle area MA than the first pixel circuit PC1. In other words, the first pixel circuit PC1 may be arranged between the second pixel circuit PC2 and the middle area MA.

The third pixel circuit PC3 may be electrically connected to the display element DPE arranged in the extension area EA. Thus, the third pixel circuit PC3 may drive the display element DPE arranged in the extension area EA. The third pixel circuit PC3 may be arranged in the extension area EA. In particular, the third pixel circuit PC3 may be arranged in the pixel area PXA of the extension area EA. According to an embodiment, the third pixel circuit PC3 may be arranged to be farther from the middle area MA than the second pixel circuit PC2. In other words, the second pixel circuit PC2 may be arranged between the first pixel circuit PC1 and the third pixel circuit PC3.

The driving circuit DC may be arranged in the middle area MA. The driving circuit DC may be configured to transmit a signal to the pixel circuit PC through the signal line SGL. According to an embodiment, the driving circuit DC may include a first driving circuit DC1 and a second driving circuit DC2. According to an embodiment, any one of the first driving circuit DC1 and the second driving circuit DC2 may be configured to transmit an emission control signal through the signal line SGL. The other of the first driving circuit DC1 and the second driving circuit DC2 may be configured to transmit a scan signal or a previous scan signal through the signal line SGL.

The signal line SGL may be electrically connected to the driving circuit DC. The signal line SGL may be configured to transmit a signal generated by the driving circuit DC to the pixel circuit PC. FIG. 7B illustrates that the signal line SGL is electrically connected to the first driving circuit DC1. However, according to another embodiment, the signal line SGL may be electrically connected to the second driving circuit DC2.

The signal line SGL may extend from the middle area MA to the extension area EA. For example, the signal line SGL may extend in the extension direction EDR of the extension area EA. According to an embodiment, the signal line SGL may further extend onto the third pixel circuit PC3 arranged at an end of the extension area EA. Although not shown, in the extension area EA, the signal line SGL may be electrically connected to the pixel circuit PC arranged in the extension area EA through a bridge line. According to an embodiment, the bridge line may extend in a vertical direction VDR crossing the extension direction EDR at right angles. Here, the extension direction EDR and the vertical direction VDR are parallel to a plane defined by the first direction and the second direction. According to another embodiment, although not shown, the signal line SGL may extend from the middle area MA to the center area CA. Thus, the signal line SGL may be configured to transmit a signal to the pixel circuit PC arranged in the center area CA.

According to an embodiment, the signal line SGL may be configured to transmit a scan signal. According to another embodiment, the signal line SGL may be configured to transmit a previous scan signal. According to another embodiment, the signal line SGL may be configured to transmit an emission control signal.

The connection line CWL may be configured to electrically connect the pixel circuit PC with the display element DPE. The connection line CWL may be configured to electrically connect the pixel circuit PC with the display element DPE, where the pixel circuit PC and the display element DPE are arranged in different areas from each other. Thus, locations of the pixel circuit PC and the display element DPE corresponding to the pixel circuit PC may be different from each other. According to an embodiment, the connection line CWL and the second line WL2 may be arranged in the same layer as each other. The connection line CWL and the second line WL2 may include the same material and may be formed by the same process as each other. The connection line CWL may include a first connection line CWL1, a second connection line CWL2, and a third connection line CWL3.

The first connection line CWL1 may be electrically connected with the first pixel circuit PC1. The first connection line CWL1 may be electrically connected with the display element DPE arranged in the middle area MA. The first connection line CWL1 may extend from the corner area CNA to the middle area MA. Thus, the first connection line CWL1 may extend between the first portion P1 and the second portion P2 of the second line WL2. The first connection line CWL1 may be arranged in the same layer as the second line WL2, but the first connection line CWL1 and the second line WL2 may be spaced apart from each other. Also, the first connection line CWL1 may be arranged in a different layer from the first line WL1, and thus, the first connection line CWL1 and the first line WL1 may cross each other. Thus, the first connection line CWL1 may electrically connect the first pixel circuit PC1 arranged in the extension area EA with the display element DPE arranged in the middle area MA.

The second connection line CWL2 may be electrically connected with the second pixel circuit PC2. The second connection line CWL2 may be electrically connected with the display element DPE arranged in the extension area EA. The second connection line CWL2 may extend between the first portion P1 and the second portion P2 of the second line WL2. The second connection line CWL2 may be arranged in the same layer as the second line WL2, but the second connection line CWL2 and the second line WL2 may be spaced apart from each other.

The third connection line CWL3 may be electrically connected with the third pixel circuit PC3. The third connection line CWL3 may be electrically connected with the display element DPE arranged in the extension area EA. The third connection line CWL3 may extend between the first portion P1 and the second portion P2 of the second line WL2. The third connection line CWL3 may be arranged in the same layer as the second line WL2, but the third connection line CWL3 and the second line WL2 may be spaced apart from each other.

The driving voltage line PL may be arranged in the middle area MA. According to an embodiment, the driving voltage line PL may extend in an extension direction of the middle area MA. The driving voltage line PL may be closer to the center area CA than the first line WL1. According to an embodiment, the driving circuit DC may be arranged between the driving voltage line PL and the first line WL1. The driving voltage line PL may be a power line configured to supply the first power voltage ELVDD (see FIG. 4A). Although not shown, the driving voltage line PL may be electrically connected to the pixel circuit PC through an additional line electrically connected with the driving voltage line PL. According to an embodiment, the driving voltage line PL and the first line WL1 may be arranged in the same layer as each other.

The display element DPE may be arranged on the substrate 100. According to an embodiment, the display element DPE may be arranged on at least one of the center area CA, the middle area MA, and the extension area EA. The display element DPE may realize a pixel. In other words, the pixel may include the display element DPE. The pixel may include a plurality of sub-pixels. For example, the plurality of sub-pixels may include a red sub-pixel, a green sub-pixel, and a blue sub-pixel. According to another embodiment, the plurality of sub-pixels may include a red sub-pixel, a green sub-pixel, a blue sub-pixel, and a white sub-pixel. Hereinafter, descriptions are given in detail by focusing on a case in which the plurality of sub-pixels include the red sub-pixel, the green sub-pixel, and the blue sub-pixel.

The red sub-pixel may include a red display element DPEr for emitting red light. The green sub-pixel may include a green display element DPEg for emitting green light. The blue sub-pixel may include a blue display element DPEb for emitting blue light. According to an embodiment, the red sub-pixel, the green sub-pixel, and the blue sub-pixel may be defined by emission areas of the red display element DPEr, the green display element DPEg, and the blue display element DPEb, respectively. FIGS. 7A and 7B illustrate that the red display element DPEr, the green display element DPEg, and the blue display element DPEb are arranged in an S-stripe structure. For example, the red display element DPEr and the blue display element DPEb may be arranged in parallel in the vertical direction VDR, the red display element DPEr and the green display element DPEg may be arranged in parallel in the extension direction EDR, and the blue display element DPEb and the green display element DPEg may be arranged in parallel in the extension direction EDR. However, the arrangement of the red display element DPEr, the green display element DPEg, and the blue display element DPEb may not be limited thereto. According to another embodiment, the red display element DPEr, the green display element DPEg, and the blue display element DPEb may be arranged in a pentile Matrix™ structure. According to an embodiment, the arrangement of the red display element DPEr, the green display element DPEg, and the blue display element DPEb in the center area CA may be different from the arrangement of the red display element DPEr, the green display element DPEg, and the blue display element DPEb in the extension area EA and the middle area MA. For example, the red display element DPEr, the green display element DPEg, and the blue display element DPEb may be arranged in the pentile Matrix™ structure in the center area CA and may be arranged in the S-stripe structure in the extension area EA and the middle area MA.

The display element DPE may include a first display element DPE1, a second display element DPE2, and a third display element DPE3. The first display element DPE1 may be arranged in the middle area MA. The first display element DPE1 may be electrically connected with the first connection line CWL1. Thus, the display panel 10 may display an image in the middle area MA. According to an embodiment, the first display element DPE1 may include the red display element DPEr, the green display element DPEg, and the blue display element DPEb, and in this case, the first pixel circuit PC1 and the first connection line CWL1 may be provided in a multiple number.

The second display element DPE2 may be arranged in the extension area EA. The second display element DPE2 may be electrically connected with the second connection line CWL2. Thus, the display panel 10 may display an image in the extension area EA. According to an embodiment, the second display element DPE2 may overlap the first pixel circuit PC1 in a plan view. According to an embodiment, the second display element DPE2 may include the red display element DPEr, the green display element DPEg, and the blue display element DPEb, and in this case, the second pixel circuit PC2 and the second connection line CWL2 may be provided in a multiple number.

The third display element DPE3 may be arranged in the extension area EA. The third display element DPE3 may be electrically connected with the third connection line CWL3. Thus, the display panel 10 may display an image in the extension area EA. According to an embodiment, the third display element DPE3 may be arranged to be farther from the middle area MA than the second display element DPE2. In other words, the second display element DPE2 may be arranged between the first display element DPE1 and the third display element DPE3. According to an embodiment, the third display element DPE3 may overlap the second pixel circuit PC2. According to an embodiment, the third pixel circuit PC3 may not overlap the display element DPE in a plan view. According to an embodiment, the third display element DPE3 may include the red display element DPEr, the green display element DPEg, and the blue display element DPEb, and in this case, the third pixel circuit PC3 and the third connection line CWL3 may be provided in a multiple number.

Figure 8:
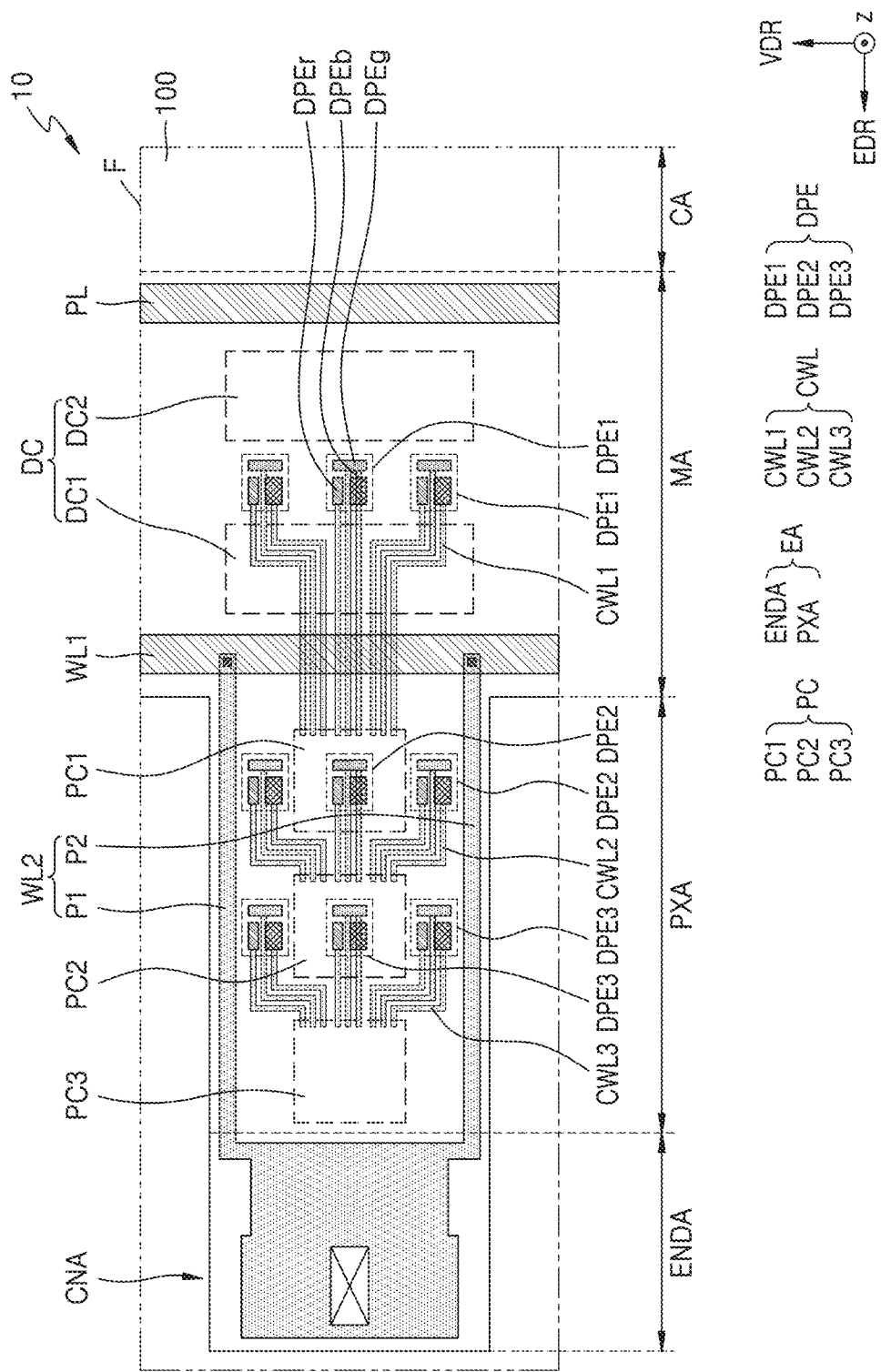
FIG. 8 is an enlarged schematic plan view of the region F of the display panel of FIG. 6, according to another embodiment.

FIG. 8 is an enlarged schematic plan view of the region F of the display panel 10 of FIG. 6, according to another embodiment. With respect to FIG. 8, the same reference signs as used in FIG. 7A denote the same members, and thus, are not repeatedly described.

Referring to FIG. 8, the display panel 10 may include the substrate 100, the first line WL1, the second line WL2, the pixel circuit PC, the driving circuit DC, the connection line CWL, the driving voltage line PL, and the display element DPE. The substrate 100 may include the center area CA, the corner area CNA, and the middle area MA.

The display element DPE may be arranged on the substrate 100. According to an embodiment, the display element DPE may be arranged on at least one of the center area CA, the middle area MA, and the extension area EA. The display element DPE may include the first display element DPE1, the second display element DPE2, and the third display element DPE3.

The second display element DPE2 may be provided in a multiple number in the extension area EA. In other words, the plurality of second display elements DPE2 may be arranged in one extension area EA. In the extension area EA, the plurality of second display elements DPE2 may be arranged in parallel with each other in a direction crossing the extension direction EDR of the extension area EA at right angles. For example, the plurality of second display elements DPE2 may be arranged in parallel with each other in the vertical direction VDR, in the extension area EA. According to an embodiment, the plurality of second display elements DPE2 may be electrically connected with a plurality of pixel circuits, respectively, and may independently operate from each other.

The third display element DPE3 may be provided in a multiple number in the extension area EA. In other words, the plurality of third display elements DPE3 may be arranged in one extension area EA. In the extension area EA, the plurality of third display elements DPE3 may be arranged in parallel with each other in a direction crossing the extension direction EDR of the extension area EA at right angles. For example, the plurality of third display elements DPE3 may be arranged in parallel with each other in the vertical direction VDR, in the extension area EA. According to an embodiment, the plurality of third display elements DPE3 may be electrically connected with the plurality of pixel circuits, respectively, and may independently operate from each other. The plurality of second display elements DPE2 and the plurality of third display elements DPE3 may be arranged in parallel with each other in the extension direction EDR.

According to an embodiment, the first display element DPE1 may be provided in a multiple number in the middle area MA. According to an embodiment, the plurality of first display elements DPE1 may be electrically connected with the plurality of pixel circuits, respectively, and may independently operate from each other. The plurality of first display elements DPE1, the plurality of second display elements DPE2, and the plurality of third display elements DPE3 may be arranged in parallel with each other in the extension direction EDR. Thus, the resolution of the corner area CNA and the middle area MA of the display panel 10 may increase.

Figure 9:
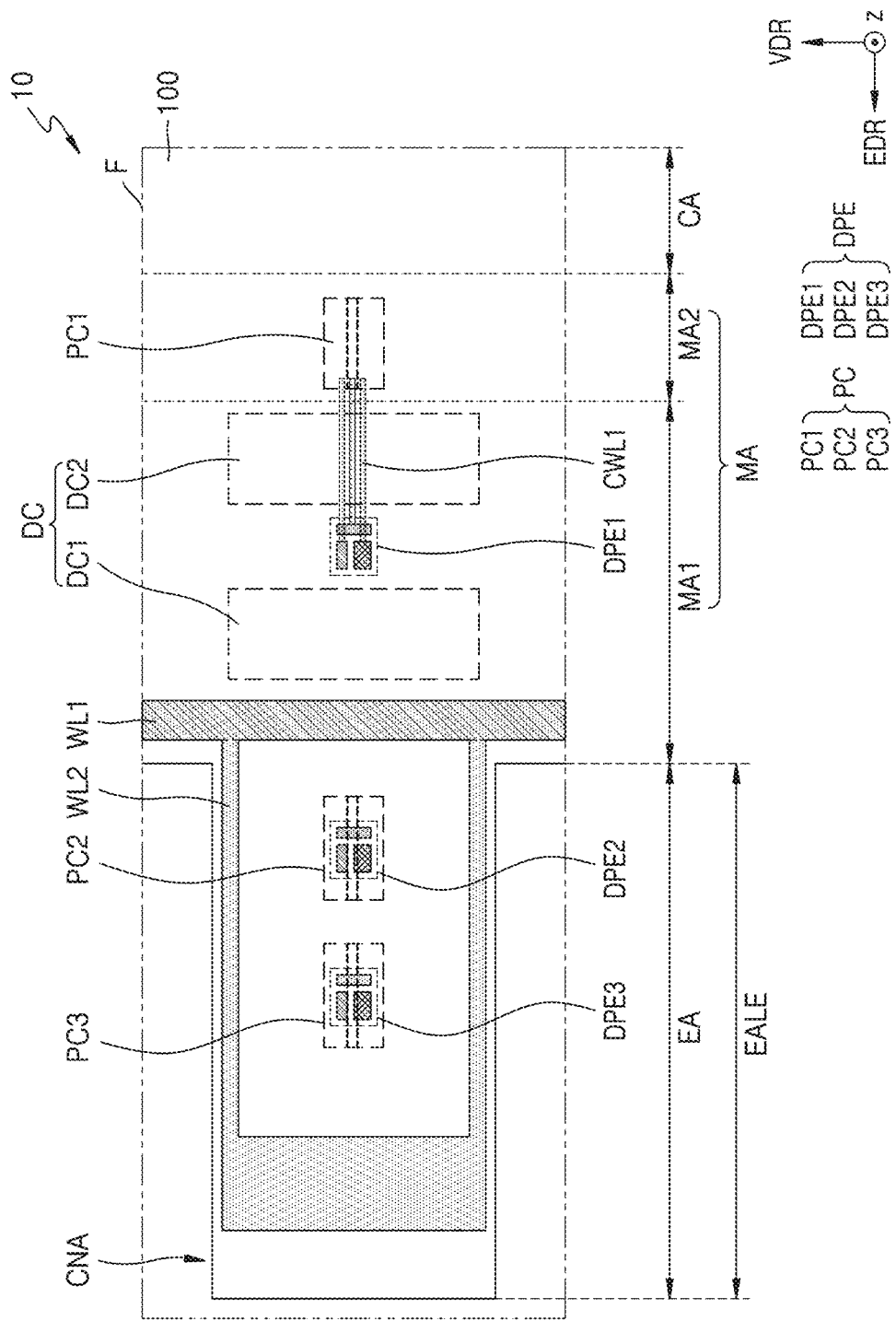
FIG. 9 is an enlarged schematic plan view of the region F of the display panel of FIG. 6, according to a comparative embodiment.

FIG. 9 is an enlarged schematic plan view of the region F of the display panel 10 of FIG. 6, according to a comparative embodiment.

Referring to FIG. 9, the display panel 10 according to the comparative embodiment may include the substrate 100, the first line WL1, the second line WL2, the pixel circuit PC, the driving circuit DC, the connection line CWL, and the display element DPE. The substrate 100 may include the center area CA, the corner area CNA, and the middle area MA. The middle area MA may include a first middle area MA1 and a second middle area MA2. The second middle area MA2 may be arranged between the first middle area MA1 and the center area CA.

The first line WL1 may be arranged in the middle area MA. The first line WL1 according to the comparative embodiment may be a dual line arranged below and above the first insulating layer 115.

The pixel circuit PC may be arranged on the substrate 100. The pixel circuit PC may include the first pixel circuit PC1, the second pixel circuit PC2, and the third pixel circuit PC3. The first pixel circuit PC1 may be arranged in the second middle area MA2.

The driving circuit DC may be arranged in the first middle area MA1.

The connection line CWL may be configured to electrically connect the pixel circuit PC with the display element DPE. The connection line CWL may include the first connection line CWL1, the second connection line CWL2, and the third connection line CWL3. The first connection line CWL1 may extend from the second middle area MA2 to the first middle area MA1.

When the first pixel circuit PC1 is arranged in the second middle area MA2 as described according to the comparative embodiment, a length EALE of the extension area EA in the extension direction EDR, according to the comparative embodiment, may be less than a length EAL (see FIG. 7A) of the extension area EA in the extension direction EDR, according to an embodiment. In other words, when the extension area EA according to the comparative embodiment is provided in a multiple number, a size of a space area SA between an adjacent pair of the extension areas EA may not be sufficient. In this case, even when the space area SA is provided between the adjacent extension areas EA, the display panel 10 may be damaged in the corner area CNA, when the corner area CNA is bent.

In contrast, according to an embodiment of the present invention, the first pixel circuit PC1 may be arranged in the extension area EA. In this case, the space area SA between the adjacent extension areas EA may be sufficiently obtained. Thus, when the corner area CNA is bent, the damage to the display panel 10 in the corner area CNA may be effectively prevented or reduced.

According to the comparative embodiment in FIG. 9, even when the first pixel circuit PC1 is arranged in the extension area EA, given that the first line WL1 is a dual line, the first pixel circuit PC1 and the first display element DPE1 may not be electrically connected with each other through the first connection line CWL1.

In contrast, according to an embodiment of the present invention, the first line WL1 may be a single line arranged on a layer, and the first connection line CWL1 may extend from the extension area EA to the middle area MA, between the first portion P1 and the second portion P2 of the second line WL2. Thus, even when the first pixel circuit PC1 is arranged in the extension area EA, the first pixel circuit PC1 and the first display element DPE1 may be electrically connected with each other through the first connection line CWL1.

Figure 10:
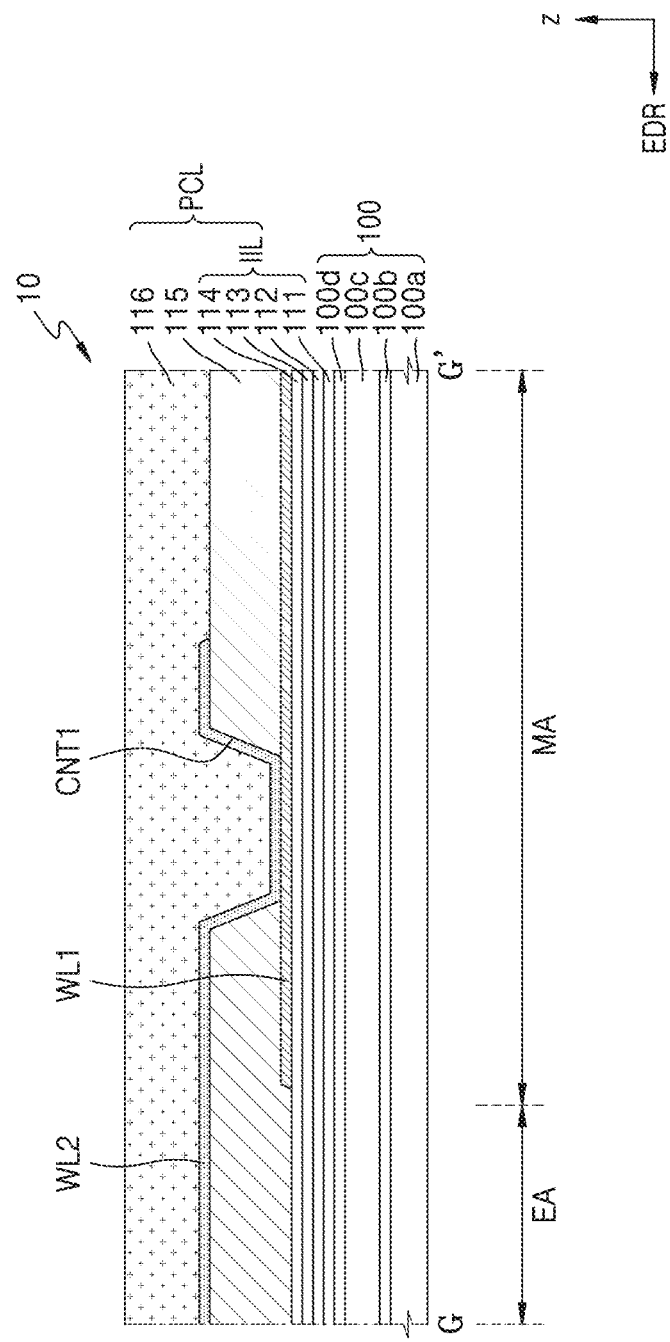
FIG. 10 is a schematic cross-sectional view of a display panel of FIG. 7A, taken along line G-G'.
Figure 11:
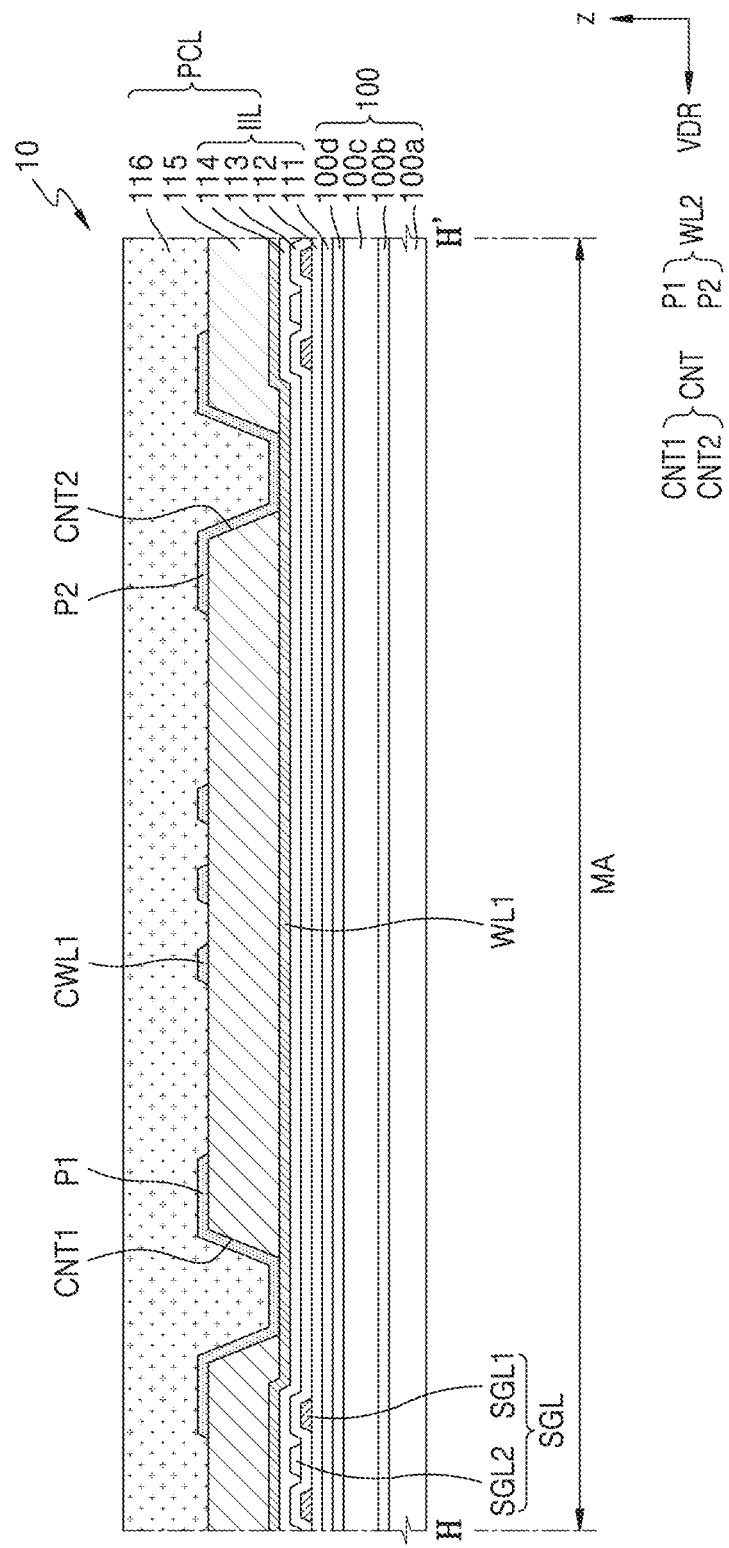
FIG. 11 is a schematic cross-sectional view of the display panel of FIG. 7A, taken along line H-H'.

FIG. 10 is a schematic cross-sectional view of the display panel 10 of FIG. 7A, taken along line G-G'. FIG. 11 is a schematic cross-sectional view of the display panel 10 of FIG. 7A, taken along line H-H'. FIGS. 10 and 11 schematically illustrate the substrate 100 and the pixel circuit layer PCL of the display panel 10.

Referring to FIG. 10, the display panel 10 may include the substrate 100 and the pixel circuit layer PCL. The substrate 100 may include the middle area MA and the extension area EA. The extension area EA may extend from the middle area MA in the extension direction EDR. The pixel circuit layer PCL may include the inorganic insulating layer IIL, the first line WL1, the first insulating layer 115, the second line WL2, and the second insulating layer 116. The inorganic insulating layer IIL may be arranged on the substrate 100. The inorganic insulating layer IIL may include the buffer layer 111, the first gate insulating layer 112, the second gate insulating layer 113, and the interlayer insulating layer 114.

The first line WL1 may be arranged on the inorganic insulating layer IIL. The first line WL1 may be arranged in the middle area MA. The first line WL1 may include a highly conductive material. The first line WL1 may include a conductive material including Mo, Al, Cu, Ti, etc. and may include layers or a single layer including the conductive materials described above. According to an embodiment, the first line WL1 may have a multi-layered structure of Ti/Al/Ti. According to an embodiment, the first line WL1 may include the same material and may be formed by using the same process as the first source electrode SE1, the first drain electrode DE1, the second source electrode SE2, and the second drain electrode DE2 of FIG. 5.

The first insulating layer 115 may be arranged on the first line WL1 and the inorganic insulating layer IL. The first insulting layer 115 may define a first contact hole CNT1 therein. The first contact hole CNT1 may expose the first line WL1.

The second line WL2 may be arranged on the first insulating layer 115. The second line WL2 may extend from the middle area MA to the extension area EA. The second line WL2 and the first line WL1 may be electrically connected with each other through the first contact hole CNT1.

The second line WL2 may include a conductive material including Mo, Al, Cu, Ti, etc. and may include layers or a single layer including the conductive materials described above. According to an embodiment, the second line WL2 may have a multi-layered structure of Ti/Al/Ti. According to an embodiment, the second line WL2 may include the same material and may be formed by using the same process as the connection electrode CML of FIG. 5.

The second insulating layer 116 may be arranged on the second line WL2 and the first insulating layer 115. In other words, the second line WL2 may be arranged between the first insulating layer 115 and the second insulating layer 116.

Referring to FIG. 11, the display panel 10 may include the substrate 100 and the pixel circuit layer PCL. The pixel circuit layer PCL may include the inorganic insulating layer IIL, the signal line SGL, the first line WL1, the first insulating layer 115, the second line WL2, and the first connection line CWL1. The substrate 100 may include the middle area MA. The inorganic insulating layer IIL may include the buffer layer 111, the first gate insulating layer 112, the second gate insulating layer 113, and the interlayer insulating layer 114.

The signal line SGL may include a first signal line SGL1 and a second signal line SGL2. According to an embodiment, the first signal line SGL1 may be arranged between the first gate insulating layer 112 and the second gate insulating layer 113. The first signal line SGL1 may include a low-resistance metal material. The first signal line SGL1 may include a conductive material including Mo, Al, Cu, Ti, etc. and may include layers or a single layer including the conductive materials described above. According to an embodiment, the first signal line SGL1 may include the same material and may be formed by using the same process as the first gate electrode GE1 and the second gate electrode GE2 of FIG. 5.

The second signal line SGL2 may be arranged between the second gate insulating layer 113 and the interlayer insulating layer 114. The second signal line SGL2 may include Al, Pt, Pd, Ag, Mg, Au, Ni, Nd, Ir, Cr, Ca, Mo, Ti, W, and/or Cu and may include a single layer or layers including the materials described above. According to an embodiment, the second signal line SGL2 may include the same material and may be formed by using the same process as the upper electrode CE2 of FIG. 5.

According to an embodiment, the first signal line SGL1 and the second signal line SGL2 may be alternately arranged in the vertical direction VDR. Thus, when the first signal line SGL1 and the second signal line SGL2 extend to the extension area EA, an increase of a width of the extension area EA in the vertical direction VDR, due to the first signal line SGL1 and the second signal line SGL2, may be effectively prevented or reduced.

The first line WL1 may be arranged on the inorganic insulating layer IIL, and the first insulating layer 115 may be arranged on the first line WL1. The first insulating layer 115 may define a contact hole CNT. According to an embodiment, the contact hole CNT may include the first contact hole CNT1 and a second contact hole CNT2.

The second line WL2 and the first connection line CWL1 may be arranged on the first insulating layer 115. The second insulating layer 116 may be arranged on the second line WL2, the first connection line CWL1, and the first insulating layer 115. The second line WL2 may be electrically connected with the first line WL1 through the contact hole CNT. According to an embodiment, the second line WL2 may include the first portion P1 and the second portion P2. The first portion P1 may be electrically connected with the first line WL1 through the first contact hole CNT1. The second portion P2 may be electrically connected with the first line WL1 through the second contact hole CNT2.

The first connection line CWL1 and the second line WL2 may be arranged in the same layer as each other. According to an embodiment, the first connection line CWL1 may be arranged between the first insulating layer 115 and the second insulating layer 116. The first connection line CWL1 may be arranged between the first portion P1 and the second portion P2 of the second line WL2. The first connection line CWL1 may include the same material and may be formed by the same process as the second line WL2. Thus, the first connection line CWL1 and the second line WL2 may be formed without increasing the number of masks, and the display panel 10 may display an image also in the middle area MA.

Figure 12:
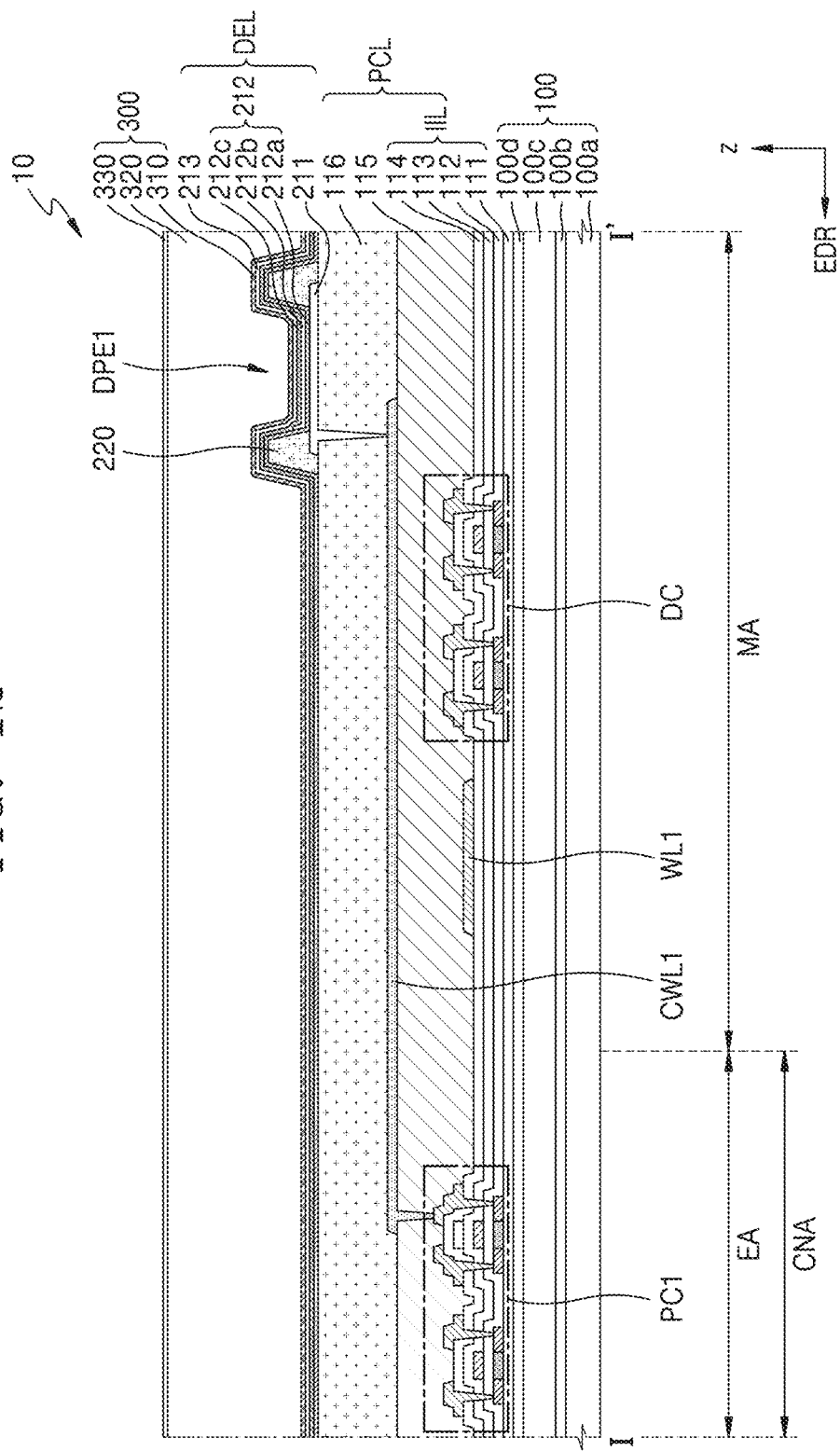
FIG. 12 is a schematic cross-sectional view of the display panel of FIG. 7A, taken along line I-I'.

FIG. 12 is a schematic cross-sectional view of the display panel 10 of FIG. 7A, taken along line I-I'. With respect to FIG. 12, the same reference signs as used in FIG. 5 denote the same members, and thus, their descriptions are not repeated.

Referring to FIG. 12, the display panel 10 may include the substrate 100, the pixel circuit layer PCL, the display element layer DEL, and the encapsulation layer 300. The substrate 100 may include the middle area MA and the corner area CNA. The corner area CNA may include the extension area EA. The extension area EA may extend from the middle area MA in the extension direction EDR.

The pixel circuit layer PCL may include the inorganic insulating layer IIL, the first line WL1, the first pixel circuit PC1, the driving circuit DC, the first insulating layer 115, the first connection line CWL1, and the second insulating layer 116.

The first pixel circuit PC1 may be arranged in the extension area EA. The first pixel circuit PC1 may include at least one thin-film transistor. The driving circuit DC may be arranged in the middle area MA. The driving circuit DC may include at least one thin-film transistor.

The inorganic insulating layer IIL may be arranged on the substrate 100. The first line WL1 may be arranged in the middle area MA. The first line WL1 may be arranged on the inorganic insulating layer IL.

The first insulating layer 115 may be arranged on the first pixel circuit PC1, the first line WL1, the driving circuit DC, and the inorganic insulating layer IIL.

The first connection line CWL1 may be arranged on the first insulating layer 115. The first connection line CWL1 may be electrically connected with the first pixel circuit PC1 through a hole of the first insulating layer 115. The first connection line CWL1 may extend from the corner area CNA to the middle area MA. According to an embodiment, the first connection line CWL1 may overlap the first line WL1 and/or the driving circuit DC in a thickness direction (for example, a z direction) of the substrate 100.

The second insulating layer 116 may be arranged on the first insulating layer 115 and the first connection line CWL1.

The display element layer DEL may be arranged on the pixel circuit layer PCL. The display element layer DEL may include the first display element DPE1 arranged in the middle area MA. The first display element DPE1 may be electrically connected with the first connection line CWL1. For example, the first display element DPE1 may be electrically connected with the first connection line CWL1 through a hole of the second insulating layer 116. The first display element DPE1 may include the pixel electrode 211, the intermediate layer 212, and the opposite electrode 213. According to an embodiment, the pixel electrode 211 may be electrically connected with the first connection line CWL1 through the hole of the second insulating layer 116.

The encapsulation layer 300 may be arranged on the display element layer DEL.

Figure 13:
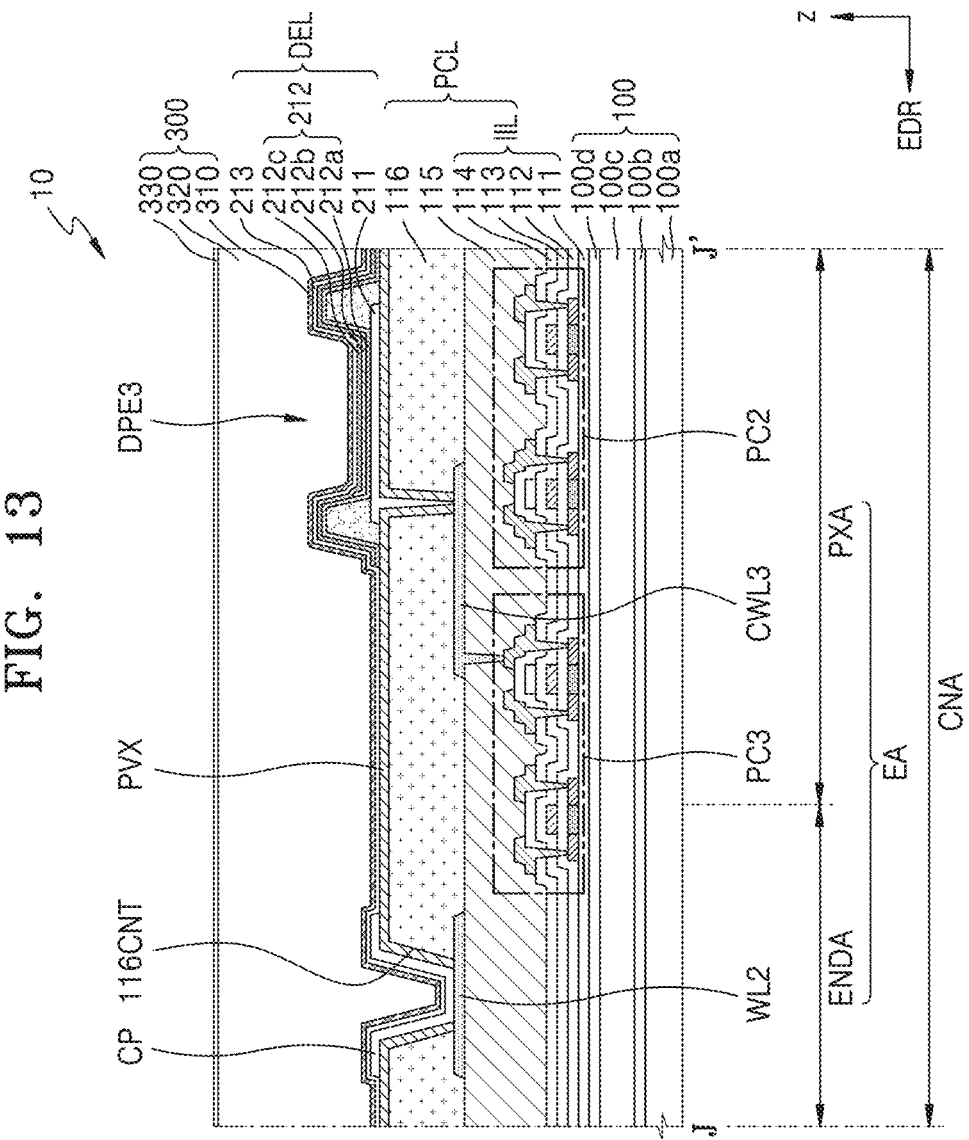
FIG. 13 is a schematic cross-sectional view of the display panel of FIG. 7A, taken along line J-J'.

FIG. 13 is a schematic cross-sectional view of the display panel 10 of FIG. 7A, taken along line J-J'. With respect to FIG. 13, the same reference signs as used in FIG. 5 denote the same members, and thus, their descriptions are not repeated.

Referring to FIG. 13, the display panel 10 may include the substrate 100, the pixel circuit layer PCL, an inorganic layer PVX, the display element layer DEL, and the encapsulation layer 300. The substrate 100 may include the corner area CNA. The corner area CNA may include the extension area EA. The extension area EA may extend in the extension direction EDR. The extension area EA may include the pixel area PXA and the end area ENDA.

The pixel circuit layer PCL may include the inorganic insulating layer IIL, the second pixel circuit PC2, the third pixel circuit PC3, the first insulating layer 115, the second line WL2, the third connection line CWL3, and the second insulating layer 116. The second pixel circuit PC2 and the third pixel circuit PC3 may be arranged in the extension area EA. The second pixel circuit PC2 and the third pixel circuit PC3 may include at least one thin-film transistor.

The inorganic insulating layer IIL may be arranged on the substrate 100. The first insulating layer 115 may be arranged on the second pixel circuit PC2, the third pixel circuit PC3, and the inorganic insulating layer IL.

The second line WL2 and the third connection line CWL3 may be arranged on the first insulating layer 115. The second line WL2 and the third connection line CWL3 may include the same material and may be formed by the same process as each other. The third connection line CWL3 may be electrically connected with the third pixel circuit PC3 through a hole of the first insulating layer 115. According to an embodiment, the third connection line CWL3 may extend from an area in which the third pixel circuit PC3 is arranged to an area in which the second pixel circuit PC2 is arranged.

The second insulating layer 116 may be arranged on the first insulating layer 115, the second line WL2, and the third connection line CWL3. The second insulating layer 116 may define a connection contact hole 116CNT. The connection contact hole 116CNT may expose the second line WL2. The second insulating layer 116 may define a hole exposing the third connection line CWL3.

The inorganic layer PVX may be arranged on the second insulating layer 116. The inorganic layer PVX may include, for example, an inorganic insulating material, such as $SiO_2$, $SiN_x$, and/or SiON. In some embodiments, the inorganic layer PVX may be omitted. The inorganic layer PVX may define a first opening portion overlapping the connection contact hole 116CNT of the second insulating layer 116 and a second opening portion overlapping the hole of the second insulating layer 116 in a plan view, where the hole exposes the third connection line CWL3.

The display element layer DEL may be arranged on the pixel circuit layer PCL. According to an embodiment, the display element layer DEL may be arranged on the inorganic layer PVX. The display element layer DEL may include an electrode pattern CP and the third display element DPE3.

The electrode pattern CP may be arranged in the end area ENDA. The electrode pattern CP may be electrically connected to the second line WL2 through the connection contact hole 116CNT of the second insulating layer 116. The electrode pattern CP may include a conductive oxide, such as ITO, IZO, ZnO, $In_2O_3$, IGO, or AZO. According to another embodiment, the electrode pattern CP may include a reflective layer including Ag, Mg, Al, Pt, Pd, Au, Ni, Nd, Ir, Cr, or a compound thereof. According to another embodiment, the electrode pattern CP may further include a layer including ITO, IZO, ZnO, or $In_2O_3$, above/below the reflective layer described above. According to an embodiment, the electrode pattern CP and the pixel electrode 211 may include the same material and may be formed by the same process as each other.

The third display element DPE3 may be arranged in the pixel area PXA. The third display element DPE3 may include the pixel electrode 211, the intermediate layer 212, and the opposite electrode 213. The opposite electrode 213 may extend from the pixel area PXA to the end area ENDA and may be electrically connected to the electrode pattern CP in the end area ENDA. Thus, the opposite electrode 213 may be electrically connected to the second line WL2 and may receive the second power voltage ELVSS (see FIG. 4A) from the second line WL2.

The intermediate layer 212 may include the first functional layer 212a, the emission layer 212b, and the second functional layer 212c. According to an embodiment, the first functional layer 212a and the second functional layer 212c may overlap the pixel area PXA and may not overlap the end area ENDA in a plan view. Thus, the first functional layer 212a and the second functional layer 212c may not contact the electrode pattern CP, and the opposite electrode 213 may directly contact the electrode pattern CP. In this case, the opposite electrode 213 may maintain a low resistance through the electrode pattern CP and may receive the second power voltage ELVSS (see FIG. 4A) from the second line WL2.

FIG. 13 illustrates that the opposite electrode 213 of the third display element DPE3 may be electrically connected to the second line WL2 and may receive the second power voltage ELVSS (see FIG. 4A). However, the opposite electrode 213 of the second display element DPE2 may also be electrically connected to the second line WL2 and may receive the second power voltage ELVSS (see FIG. 4A).

As described above, in the display panel 10 according to an embodiment, the first pixel circuit PC1 may be arranged in the extension area EA of the corner area CNA, the first connection line CWL1 may be electrically connected to the first pixel circuit PC1 and may extend from the corner area CNA to the middle area MA of the display panel 10 between the first portion P1 and the second portion P2 of the second line WL2, and the first display element DPE1 arranged in the middle area MA may be electrically connected to the first connection line CWL1. Thus, the size of the stress occurring in the corner area CNA may be reduced, and the reliability may be effectively increased. Also, based on the interconnection arrangement described above, the display panel 10 may also display an image in the middle area MA.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A display panel comprising:
a substrate including a center area, a corner area, and a middle area arranged between the center area and the corner area, wherein the corner area includes an extension area extending in a direction away from the center area;
a first line arranged in the middle area;
a second line electrically connected to the first line and including a first portion and a second portion which extend from the middle area to the extension area;
a first pixel circuit and a second pixel circuit arranged in the extension area;
a first connection line electrically connected to the first pixel circuit and extending from the corner area to the middle area and disposed between the first portion and the second portion of the second line;
a second connection line electrically connected to the second pixel circuit;
a first display element electrically connected to the first connection line and arranged in the middle area; and
a second display element comprising a pixel electrode electrically connected to the second connection line, an emission layer and an opposite electrode,
wherein the extension area includes a pixel area in which the second display element is arranged and an end area arranged outside the pixel area, and
the second line is connected to the opposite electrode of the second display element in the end area.

2. The display panel of claim 1, wherein
the first portion and the second portion of the second line meet each other in the end area to be integrally provided.

3. The display panel of claim 1, further comprising:
a first insulating layer arranged between the first line and the second line and defining a contact hole therein; and
a second insulating layer arranged on the second line,
wherein the first line and the second line are electrically connected to each other through the contact hole, and
the first connection line is arranged between the first insulating layer and the second insulating layer.

4. The display panel of claim 1, further comprising:
a driving circuit arranged in the middle area; and
a signal line electrically connected to the driving circuit and extending from the middle area to the extension area.

5. The display panel of claim 1,
wherein the second pixel circuit is arranged to be farther from the middle area than the first pixel circuit.

6. The display panel of claim 5, further comprising:
a third pixel circuit arranged in the extension area;
a third connection line electrically connected to the third pixel circuit; and
a third display element electrically connected to the third connection line and arranged in the pixel area,
wherein the second pixel circuit is arranged to be farther from the middle area than the third pixel circuit, and
the second display element is arranged to be farther from the middle area than the third display element.

7. The display panel of claim 6, wherein
the third display element is arranged in the pixel area and includes a pixel electrode, an emission layer, and an opposite electrode, and
the second line is electrically connected to the opposite electrode of the third display element.

8. The display panel of claim 6, wherein the third display element is provided in a multiple number in the extension area, and
the plurality of third display elements are arranged in parallel with each other in a direction crossing an extension direction of the extension area at right angles.

9. The display panel of claim 1, wherein the extension area is provided in a multiple number, and
a space area is defined between an adjacent pair of the plurality of extension areas.

10. The display panel of claim 1, wherein the substrate further includes a first area adjacent to the center area in a first direction and a second area adjacent to the center area in a second direction crossing the first direction, and the middle area and the corner area at least partially surround the first area, the center area, and the second area.

11. A display apparatus comprising:
a display panel; and
a cover window arranged on the display panel,
wherein the display panel comprises:
a substrate including a center area, a corner area, and a middle area arranged between the center area and the corner area, the corner area including an extension area extending in a direction away from the center area;
a first line arranged in the middle area;
a second line electrically connected to the first line and including a first portion and a second portion which extend from the middle area to the extension area;
a first pixel circuit and a second pixel circuit arranged in the extension area;
a first connection line electrically connected to the first pixel circuit and extending from the corner area to the middle area and disposed between the first portion and the second portion of the second line;
a second connection line electrically connected to the second pixel circuit;
a first display element electrically connected to the first connection line and arranged in the middle area, and
a second display element comprising a pixel electrode electrically connected to the second connection line, an emission layer and an opposite electrode;
wherein the extension area includes a pixel area in which the second display element is arranged and an end area arranged outside the pixel area, and
the second line is connected to the opposite electrode of the second display element in the end area,
wherein the display panel is bent in the corner area.

12. The display apparatus of claim 11, wherein the first portion and the second portion of the second line meet each other in the end area to be integrally provided.

13. The display apparatus of claim 11, wherein the display panel further comprises a first insulating layer arranged between the first line and the second line and defining a contact hole therein, and a second insulating layer arranged on the second line,
the first line and the second line are electrically connected to each other through the contact hole, and
the first connection line is arranged between the first insulating layer and the second insulating layer.

14. The display apparatus of claim 11, wherein the display panel further comprises a driving circuit arranged in the middle area, and a signal line electrically connected to the driving circuit and extending from the middle area to the extension area.

15. The display apparatus of claim 11, wherein
the second pixel circuit is arranged to be farther from the middle area than the first pixel circuit.

16. The display apparatus of claim 15, wherein the display panel further comprises:
a third pixel circuit arranged in the extension area;
a third connection line electrically connected to the third pixel circuit; and
a third display element electrically connected to the third connection line and arranged in the pixel area,
wherein the second pixel circuit is arranged to be farther from the middle area than the second third pixel circuit, and
the second display element is arranged to be farther from the middle area than the third display element.

17. The display apparatus of claim 16, wherein
the third display element is arranged in the pixel area and includes a pixel electrode, an emission layer, and an opposite electrode, and
the second line is electrically connected to the opposite electrode of the third display element.

18. The display apparatus of claim 16, wherein the third display element is provided in a multiple number in the extension area, and
the plurality of third display elements are arranged in parallel with each other in a direction crossing an extension direction of the extension area at right angles.

19. The display apparatus of claim 11, wherein the extension area is provided in a multiple number, and
a space area is defined between an adjacent pair of the plurality of extension areas.

20. The display apparatus of claim 11, wherein the substrate further includes a first area adjacent to the center area in a first direction and a second area adjacent to the center area in a second direction crossing the first direction,
the middle area and the corner area at least partially surround the first area, the center area, and the second area, and
the display panel is bent in the first area and the second area.

* * * * *